(12) United States Patent
Lin et al.

(10) Patent No.: US 11,264,283 B2
(45) Date of Patent: Mar. 1, 2022

(54) MULTI-CHANNEL DEVICES AND METHODS OF MANUFACTURE

(71) Applicant: Taiwan Semiconductor Manufacturing Co., Ltd., Hsinchu (TW)

(72) Inventors: Shih-Yao Lin, New Taipei (TW); Chih-Chung Chiu, Hsinchu (TW); Kuei-Yu Kao, Hsinchu (TW); Chen-Ping Chen, Toucheng Township (TW); Chih-Han Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/888,239

(22) Filed: May 29, 2020

(65) Prior Publication Data

US 2021/0375683 A1 Dec. 2, 2021

(51) Int. Cl.
*H01L 21/8234* (2006.01)
*H01L 29/66* (2006.01)
(Continued)

(52) U.S. Cl.
CPC ......... *H01L 21/823431* (2013.01); *H01L 21/02532* (2013.01); *H01L 21/3065* (2013.01); *H01L 21/823412* (2013.01); *H01L 21/823437* (2013.01); *H01L 27/0886* (2013.01); *H01L 29/0673* (2013.01); *H01L 29/1037* (2013.01);
(Continued)

(58) Field of Classification Search
CPC ........ H01L 21/02365; H01L 21/02518; H01L 21/02532; H01L 21/823412; H01L 21/823431; H01L 21/823437; H01L 21/823807; H01L 21/823821; H01L 21/823828; H01L 27/088; H01L 27/0886; H01L 27/092; H01L 27/0924; H01L 29/0665; H01L 29/0669; H01L 29/0673; H01L 29/1037; H01L 29/42312; H01L 29/4232; H01L 29/42392; H01L 29/66477; H01L 29/66545; H01L 29/66795;
(Continued)

(56) References Cited

U.S. PATENT DOCUMENTS 9,209,247 B2  12/2015  Colinge et al.
9,236,267 B2  1/2016  De et al.
(Continued)

*Primary Examiner* — Cheung Lee
(74) *Attorney, Agent, or Firm* — Slater Matsil, LLP

(57) ABSTRACT

The disclosure is directed towards semiconductor devices and methods of manufacturing the semiconductor devices. The methods include forming fins in a device region and forming other fins in a multilayer stack of semiconductor materials in a multi-channel device region. A topmost nanostructure may be exposed in the multi-channel device region by removing a sacrificial layer from the top of the multilayer stack. Once removed, a stack of nanostructures are formed from the multilayer stack. A native oxide layer is formed to a first thickness over the topmost nanostructure and to a second thickness over the remaining nanostructures of the stack, the first thickness being greater than the second thickness. A gate dielectric is formed over the fins in the device region. A gate electrode is formed over the gate dielectric in the device region and surrounding the native oxide layer in the multi-channel device region.

20 Claims, 14 Drawing Sheets

(51) Int. Cl.
*H01L 29/10* (2006.01)
*H01L 21/02* (2006.01)
*H01L 21/3065* (2006.01)
*H01L 27/088* (2006.01)
*H01L 29/06* (2006.01)

(52) U.S. Cl.
CPC .. *H01L 29/66545* (2013.01); *H01L 29/66795* (2013.01)

(58) Field of Classification Search
CPC ..... H01L 29/775; H01L 29/78; H01L 29/786; H01L 29/78696
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2017/0278842 A1* | 9/2017 | Song ............... H01L 21/823431 |
| 2020/0287046 A1* | 9/2020 | Frougier ............. H01L 29/0673 |
| 2020/0381427 A1* | 12/2020 | Suh ................... H01L 29/42392 |

* cited by examiner

MULTI-CHANNEL DEVICES AND METHODS OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
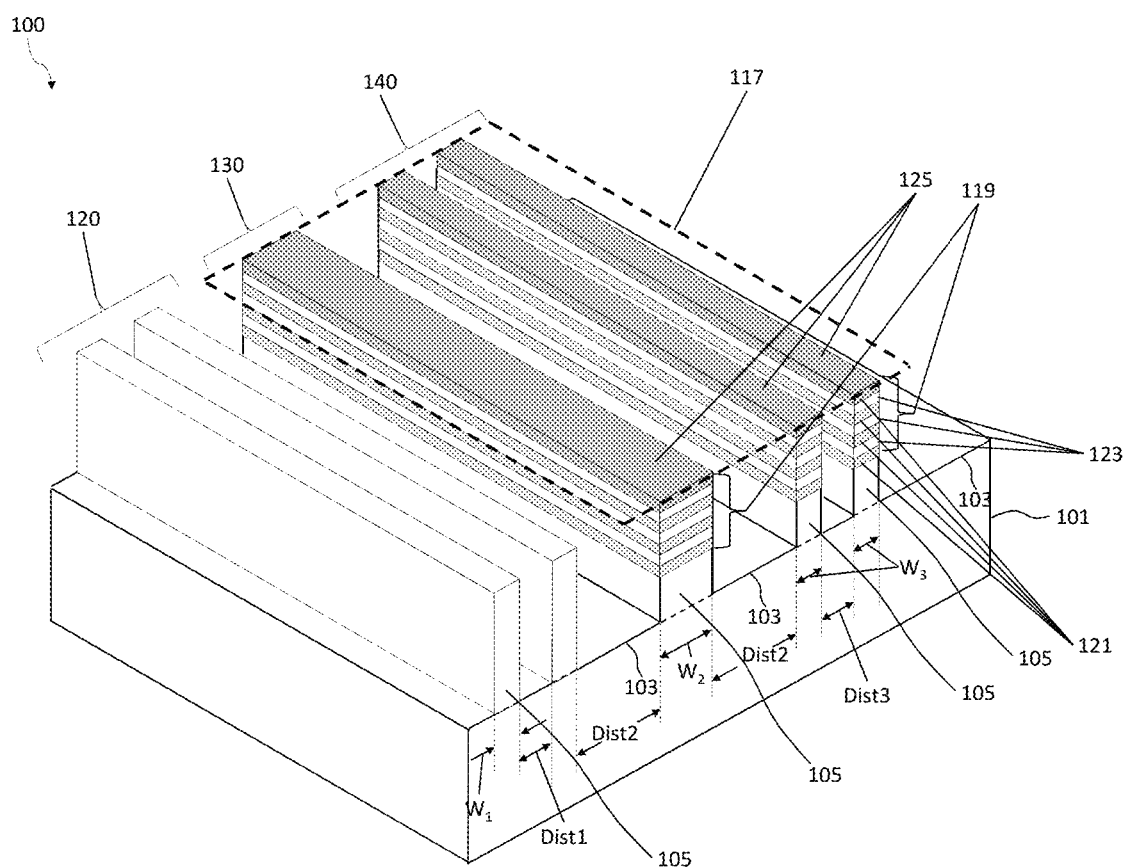
FIG. 1 illustrates, in a perspective view, a multilayer structure in an intermediate step of forming an integrated circuit device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment which forms multiple active components including a fin field effect transistor (FinFET) along with multiple nanostructure devices. However, the embodiments described are intended to be illustrative and are not intended to be limited to those embodiments that are expressly described herein. Rather, the ideas presented herein may be incorporated into a wide variety of embodiments.

With reference now to FIG. 1, there is shown a structure 100 comprising a substrate 101 with first trenches 103 formed therein between a device region 120, a first multi-channel device region 130, and a second multi-channel device region 140. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

According to some embodiments, the substrate 101 comprises a multi-channel device region 117 intended for the formation of active devices (e.g., multi-channel devices). In such embodiments, a multi-layered stack of semiconductor materials is formed in the multi-channel device region 117 by initially forming a cavity in the substrate 101. The cavity may be formed in the substrate 101 using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the cavity.

As one of skill in the art will recognize, however, the processes and materials described above to form the masking layer are not the only method that may be used to protect portions of the substrate 101 while exposing other portions of the substrate 101 for the formation of the cavity. Any suitable process, such as a patterned and developed photoresist, may be utilized to expose portions of the substrate 101 to be removed to form the cavity. All such methods are fully intended to be included in the scope of the present embodiments.

Once a masking layer has been formed and patterned, the cavity is formed in the multi-channel device region 117 of the substrate 101. The exposed substrate 101 may be removed through a suitable process such as reactive ion etching (RIE) in order to form the cavity, although any suitable process may be used. Once the cavity is formed in the substrate 101, a series of depositions of alternating materials is performed to form the multilayer stacks 119 in the cavity of the substrate 101. In some embodiments, the multilayer stacks 119 comprise first layers 121 of a first semiconductor material and second layers 123 of a second semiconductor material.

According to some embodiments, the first layers 121 may be formed using a first semiconductor material with a first lattice constant, such as SiGe, Ge, Si, GaAs, InSb, GaSb, InAlAs, InGaAs, GaSbP, GaAsSb, combinations of these, or the like. In some embodiments, a first layer 121 of the first semiconductor material (e.g., SiGe) is epitaxially grown on the substrate 101 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. In some embodiments, the first layer 121 is formed to first thicknesses of between about 30 Å and about 300 Å. However, any suitable thickness may be utilized while remaining within the scope of the embodiments.

Once the first layer 121 has been formed within the cavity of the substrate 101, one of the second layers 123 may be formed over the first layer 121. According to some embodiments, the second layers 123 may be formed using a second semiconductor material such as Si, SiGe, Ge, GaAs, InSb, GaSb, InAlAs, InGaAs, GaSbP, GaAsSb, combinations of these, or the like with a second lattice constant that is different from the first lattice constant of the first layer 121. In a particular embodiment in which the first layer 121 is silicon germanium, the second layer 123 is a material such as silicon. However, any suitable combination of materials may be utilized for the first layers 121 and the second layers 123.

In some embodiments, the second layer 123 is epitaxially grown on the first layer 121 using a deposition technique similar to that used to form the first layer 121. However, the second layer 123 may use any of the deposition techniques suitable for forming the first layer 121, as set forth above or any other suitable techniques. According to some embodiments, the second layer 123 is formed to a similar thickness to that of the first layer 121. However, the second layer 123 may also be formed to a thickness that is different from the first layer 121. According to some embodiments, the second layer 123 may be formed to a second thickness of between about 10 Å and about 500 Å. However, any suitable thickness may be used.

Once the second layer 123 has been formed over the first layer 121, the deposition process is repeated to form the remaining material layers in the series of alternating materials of the first layers 121 and the second layers 123 until a desired topmost layer of the multilayer stacks 119 has been formed. According to the present embodiment, the first layers 121 may be formed to a same or similar first thickness and the second layers 123 may be formed to the same or similar second thickness. However, the first layers 121 may have different thicknesses from one another and/or the second layers 123 may have different thicknesses from one another and any combination of thicknesses may be used for the first layers 121 and the second layers 123.

Additionally, the topmost layer 125 is formed from a sacrificial material such as a silicon based sacrificial material layer such as SiGe, SiN, SiON, SiOCN, SiC, SiOC, combinations, or the like and may be formed using a deposition method such as chemical vapor deposition (CVD), (physical vapor deposition (PVD), atomic layer deposition (ALD), combinations, or the like. In some embodiments, the topmost layer 125 of the multilayer stacks 119 is formed as a first layer 121 (e.g., SiGe). In other embodiments, the topmost layer 125 is formed using a silicon based material that is different from the first layers 121 and the second layers 123. According to some embodiments, the topmost layer 125 is formed to a thickness of between about 0.5 Å and about 300 Å. However, any suitable thickness may be used.

Although embodiments are disclosed herein comprising three of the first layers 121 and three of the second layers 123, the multilayer stacks 119 may have any suitable number of layers. For example, the multilayer stacks 119 may comprise a number of layers in a range between 2 to 20 layers. In some embodiments, the multilayer stacks 119 may comprise equal numbers of the first layers 121 to the second layers 123; however, in other embodiments, the number of the first layers 121 may be different from the number of the second layers 123. Furthermore, the multilayer stacks 119 may be formed to fill and/or overfill the cavity in the substrate. Once formed, the multilayer stacks 119 may be planarized with the top of the substrate 101 using a suitable planarization technique such as chemical mechanical planarization (CMP).

As one of ordinary skill in the art will recognize, the process described above to form the multi-channel device region 117 is merely one potential process, and is not meant to be the only embodiment. Rather, any suitable process through which the multi-channel device region 117 may be formed may be utilized and any suitable process, including any number of masking and removal steps may be used.

Once the multi-channel device region 117 has been formed, the first trenches 103 may be formed as an initial step in the eventual formation of isolation regions 401. The first trenches 103 may be formed using a masking layer (not separately illustrated in FIG. 1) along with a suitable etching process such as those used to form the cavity described above. Once formed, the masking layer may be patterned through a suitable photolithographic process to expose those portions of the substrate 101 and the multilayer stacks 119 that will be removed to form the first trenches 103.

As one of skill in the art will recognize, however, the processes and materials described above to form the masking layer are not the only method that may be used to protect portions of the substrate 101 and the multilayer stacks 119 while exposing other portions of the substrate 101 and the multilayer stacks 119 for the formation of the first trenches 103. Any suitable process, such as a patterned and developed photoresist, may be utilized to expose those portions to be removed to form the first trenches 103. All such methods are fully intended to be included in the scope of the present embodiments.

Once the masking layer has been formed and patterned, the first trenches 103 are formed in the substrate 101 and the multilayer stacks 119. The exposed materials may be removed through suitable processes such as one or more reactive ion etches (RIE) in order to form the first trenches 103 in the substrate 101 and through the multilayer stacks 119, although any suitable process may be used.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms a plurality of fins 105 from those portions of the substrate 101 and the multilayer stacks 119 that remain unremoved. For convenience the fins 105 have been illustrated in the figures as being separated from the substrate 101 by a dashed line, although a physical indication of the separation may or may not be present. These fins 105 may be used, as discussed below, to form active components, such as FinFET transistors and/or multi-channel transistors (e.g., NSFET transistors, GAA transistors, or the like). While FIG. 1 illustrates two of the fins 105 in the device region 120, one of the fins 105 in the first multi-channel device region 130, and two of the fins 105 in the second multi-channel device region 140, any number of fins 105 may be utilized in any of these device regions.

The fins 105 in the device region 120 may be formed to have a first width $W_1$ at the surface of the substrate 101 of between about 5 nm and about 80 nm. The fin 105 in the first multi-channel device region 130 may be formed to have a second width W2 at the surface of the substrate 101 of between about 3 nm and about 500 nm. Furthermore, the fins 105 in the second multi-channel device region 140 may be formed to have a third width W3 at the surface of the substrate 101 of between about 3 nm and about 300 nm. However, any suitable widths and distances may be utilized. According to some embodiments, the distances between the fins 105 in separate regions may be close enough to share a common gate electrode with one or more other ones of the fins 105 in the other device regions.

Furthermore, while a particular embodiment has been described above to form the fins 105 of an active component in the device region 120 and the multi-channel devices structures in the first multi-channel device region 130 and the second multi-channel device region 140, these descriptions are intended to be illustrative and are not intended to be limiting. Rather, the fins 105 may be patterned by any suitable method. As another example, the fins 105 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 105. Any suitable process may be utilized.

Figure 2:
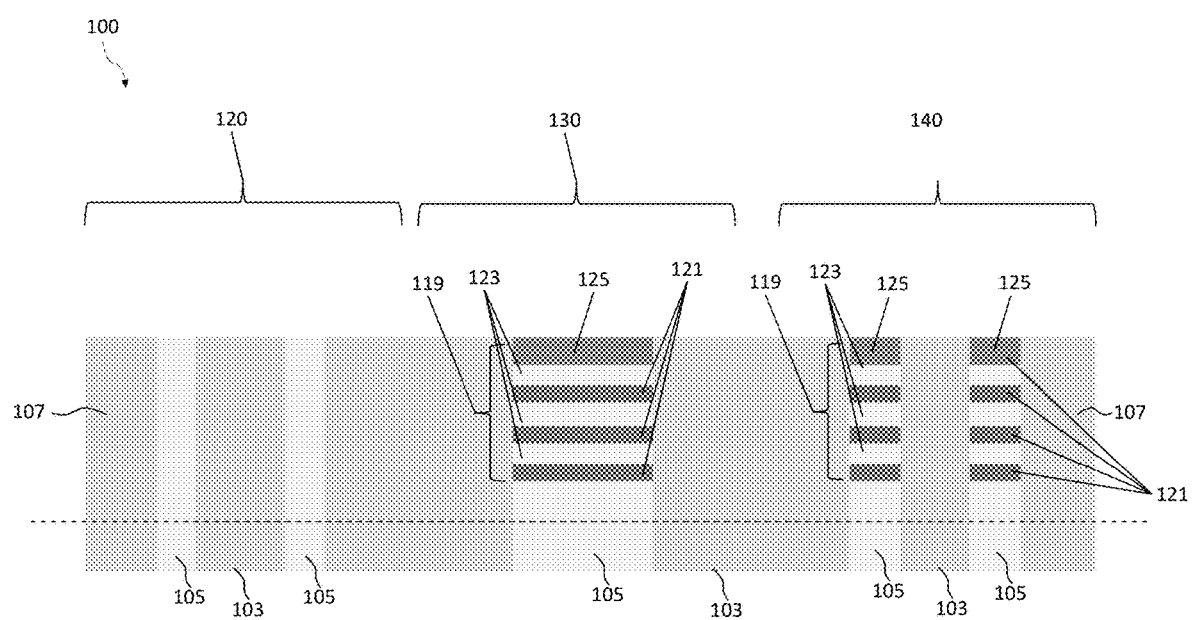
FIG. 2 illustrates a cross-sectional view of the formation of a dielectric material in preparation of forming isolation regions, in accordance with some embodiments.

FIG. 2 illustrates a cross-sectional view of the structure in FIG. 1, and further illustrates a deposition of a dielectric material 107 in preparation of forming the isolation regions 401. Once formed, the first trenches 103 may be filled with the dielectric material 107 such as an oxide material (e.g., a flowable oxide), a high-density plasma (HDP) oxide, or the like. The dielectric material 107 may be formed, after an optional cleaning and lining of the first trenches 103, using either a chemical vapor deposition (CVD) method (e.g., the HARP process), a high density plasma CVD method, or other suitable method of formation.

According to some embodiments, the first trenches 103 may be filled by overfilling the first trenches 103 with the dielectric material 107 and depositing the dielectric material 107 over the substrate 101 and over the fins 105. Once deposited, the dielectric material 107 may be planarized with the fins 105 and the topmost layers 125 of the multilayer stacks 119 by removing the excess material outside of the first trenches 103 and the fins 105 through a suitable process such as chemical mechanical polishing (CMP), an etch, a combination of these, or the like. In an embodiment, the removal process removes any other dielectric material (e.g., hardmask, masking layer, or the like) that is located over the fins 105 as well, so that the removal of the dielectric material 107 will expose the surface of the fins 105 and the topmost layers 125 of the multilayer stacks 119 to further processing steps.

Figure 3:
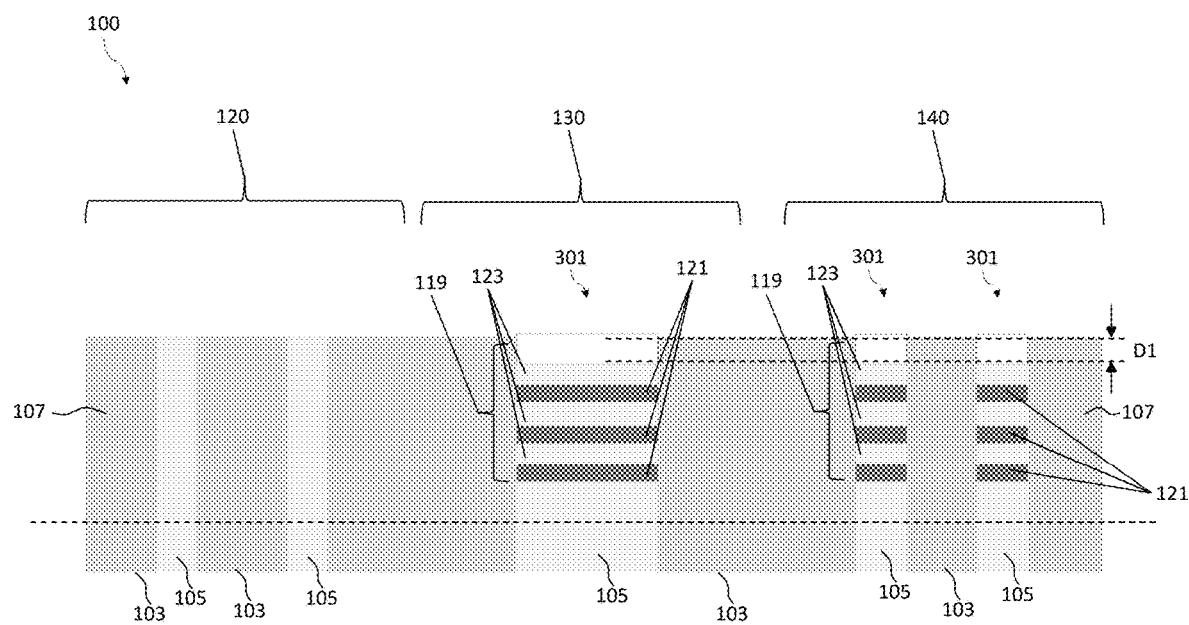
FIG. 3 illustrates a cross-sectional view of the formation of recesses in multilayer stacks, in accordance with some embodiments.

FIG. 3 illustrates the formation of recesses 301 in the multilayer stacks 119. The recesses 301 are formed by removing the sacrificial material of the topmost layers 125 of the multilayer stacks 119. In some embodiments, the recesses 301 may be formed by further removing some of the second layers 123 underlying and adjacent to the topmost layers 125. According to some embodiments, the recesses 301 may be formed by using a dry etch and/or a wet clean etch with an etchant that is more selective to the material of the topmost layers 125 (e.g., silicon germanium (SiGe)) than the material of the second layers 123 (e.g., silicon (Si)).

In embodiments, in which the topmost layers 125 are silicon germanium and the second layers 123 are silicon for example, a dry etch such as a plasma etch, a remote plasma etch, a chemical etch, or the like may be utilized to remove the topmost layers 125. According to some embodiments, the topmost layers 125 may be removed using one or more of the plasma etch, the remote etch and/or the chemical etch by introducing a first precursor (e.g., a main etching gas), a second precursor (e.g., a passivation gas), and/or a third precursor (e.g., a diluent gas) collectively as an etching environment to the material of the topmost layer 125. The first precursor may include, but is not limited to, gases such as $Cl_2$, HBr, $CF_4$, $CHF_3$, $CH_2F_2$, $CH_3F$, $C_4F_6$, $BCl_3$, $SF_6$, $H_2$, $NF_3$, combinations or the like. The second precursor may be added for tuning a selectivity of the etching process and may include, but is not limited to, gases such as $N_2$, $O_2$, $CO_2$, $SO_2$, CO, $SiCl_4$, combinations, or the like. The third precursor may include, but is not limited to, inert gases such as Ar, He, Ne, combinations, or the like. In some embodiments, the dry etch process may be conducted with a plasma source power between about 10 W and about 3000 W and with a plasma bias power between about 0 W and about 3000 W. A process pressure of the dry etch process may be between about 1 mTorr and about 10 mTorr, according to some embodiments. A process flow rate of the precursors may be between about 10 sccm and about 5000 sccm, in accordance with some embodiments. However, any suitable process conditions may be used.

In other embodiments, a wet etch process may be performed instead of the dry etching process described above, according to some embodiments, to prepare the structure for subsequent processing. In this embodiment the wet etch process may be performed using a cleaning solution comprising a main etch chemical such as HF, $F_2$, or the like, in accordance with some embodiments. In some embodiments, the cleaning solution may further comprise an etch assistant chemical for selectivity tuning of the cleaning solution. Etch assistants include but are not limited to chemicals such as $H_2SO_4$, HCl, HBr, $NH_3$, or the like. Furthermore, the cleaning solution comprises a solvent such as deionized water, alcohol, acetone, or the like for transporting the etch chemicals in the cleaning solution. According to some embodiments, the wet etch process may be performed by a dip process, a spray process, a spin-on process, or the like. However, any suitable cleaning solutions or any suitable processes may be used and are fully intended to be included within the scope of the embodiments.

According to some embodiments, the etching processes are utilized to remove portions of the sacrificial material and to form the recesses 301. For example, in some embodiments the recesses are formed in the multilayer stacks 119 to a first depth D1 of between about 0.5 nm and about 30 nm. However, any suitable depth may be used.

Additionally, in some embodiments, the etching process may also be performed to remove portions of the second layers 123 underlying and adjacent to the topmost layers 125 such that a size of the recesses extends further into the multilayer stacks 119. According to some embodiments, the recesses 301 may be formed to extend into the second layer 123 to a depth of between about 0.5 nm and about 20 nm. However, any suitable depth may be used.

Although the dry etching process and the wet clean etching process are described above, these processes are not the only process that may be utilized to recess the topmost layers 125. For example, in another embodiment the recessing of the topmost layers 125 may be performed with a wet etching process, an isotropic dry etching process or a combination of the wet etching process and the isotropic dry etching process. Any suitable process of recessing the topmost layers 125 may be utilized, and all such processes are fully intended to be included within the scope of the embodiments.

Figure 4:
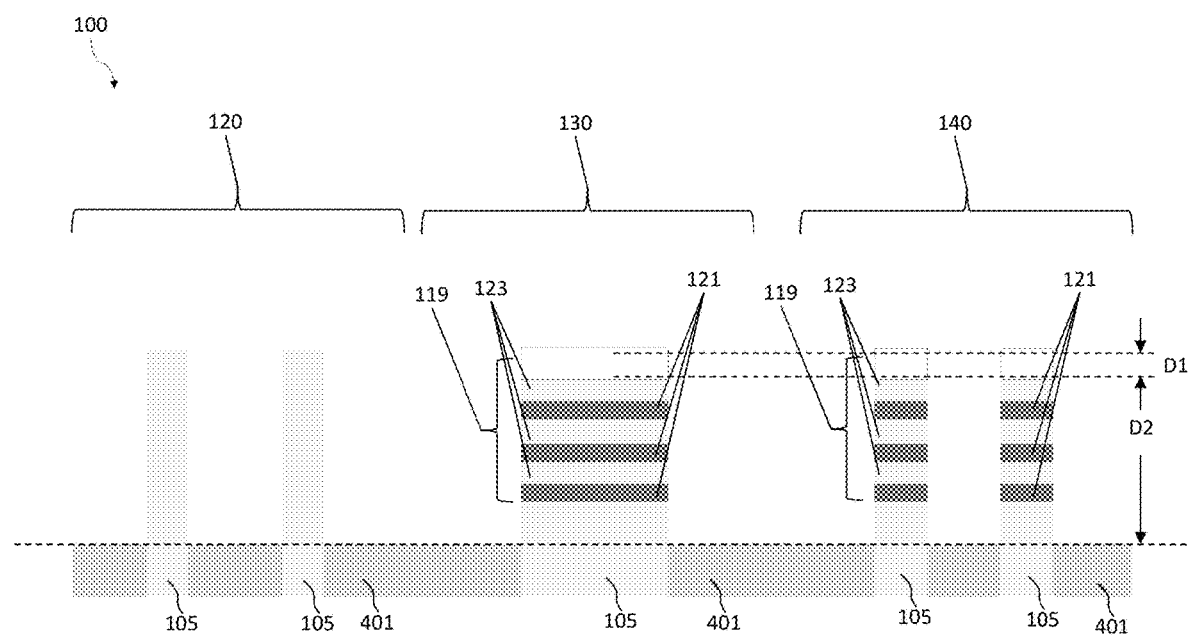
FIG. 4 illustrates a cross-sectional view of the formation of the isolation regions, in accordance with some embodiments.

FIG. 4 illustrates the formation of the isolation regions 401, in accordance with some embodiments. Once the first trenches 103 have been filled with the dielectric material 107 and the sacrificial material has been removed, the dielectric material 107 may then be recessed away from the surface of the fins 105. The recessing may be performed to expose at least a portion of the sidewalls of the fins 105 adjacent to the top surface of the fins 105. The dielectric material 107 may be recessed using a wet etch by dipping the top surface of the fins 105 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material 107 may be recessed to a second distance D2 from the surface of the fins 105 of between about 50 Å and about 2000 Å. Additionally, the recessing may also remove any other remnants of the dielectric material 107 located over the fins 105 to ensure that the fins 105 are exposed for further processing.

Figure 5:
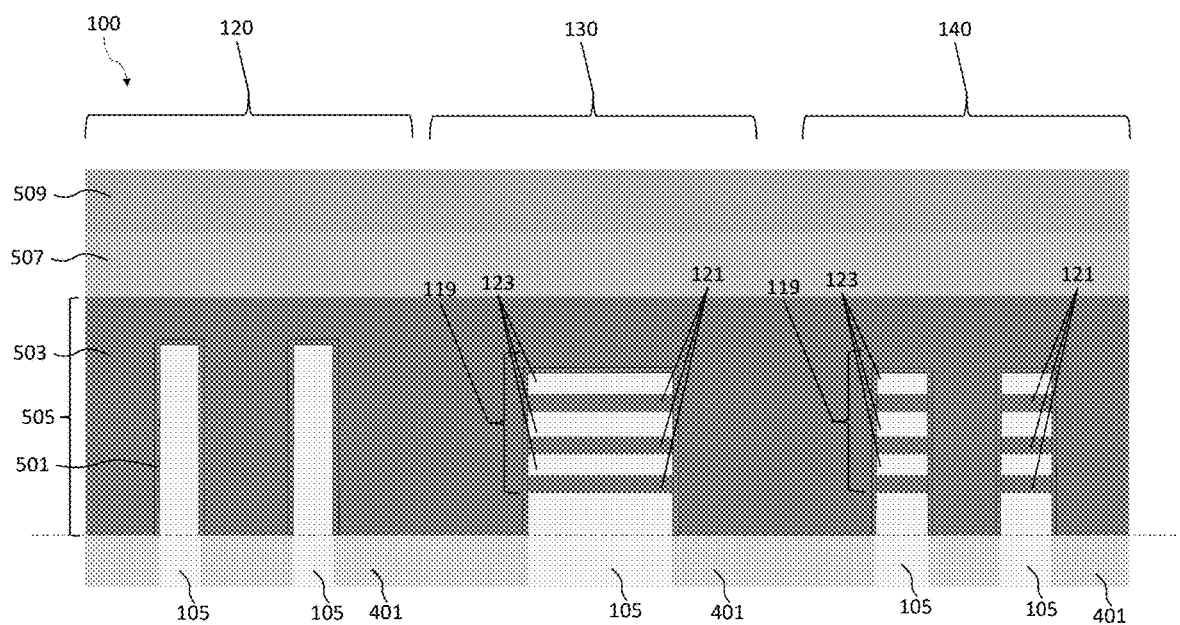
FIG. 5 illustrates a cross-sectional view of an intermediate structure after the formation of a dummy gate dielectric and a dummy gate electrode, in accordance with some embodiments.

FIG. 5 illustrates the formation of a dummy gate dielectric 501 over the exposed portions of the fins 105 and multilayer stacks 119, according to some embodiments. Once the isolation regions 401 have been formed, the dummy gate dielectric 501 may be formed by thermal oxidation, chemical vapor deposition, sputtering, or any other methods known and used in the art for forming a gate dielectric. In some embodiments, the dummy gate dielectric 501 may be formed by depositing a material such as silicon and then oxidizing or nitridizing the silicon layer in order to form a dielectric such as the silicon dioxide or silicon oxynitride. In such embodiments, the dummy gate dielectric 501 may be formed to a thickness ranging from between about 3 Å and about 100 Å. In other embodiments, the dummy gate dielectric 501 may also be formed from a high permittivity (high-k) material such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of between about 0.5 Å and about 100 Å. Additionally, any combination of silicon dioxide, silicon oxynitride, and/or high-k materials may also be used for the dummy gate dielectric 501. Depending on the precise method of formation, the dummy gate dielectric 501 may either be formed selectively on the fins 105 (as illustrated) or else may be blanket deposited over the entire structure.

FIG. 5 further illustrates the formation of a dummy gate electrode 503 over the dummy gate dielectric 501, according to some embodiments. In some embodiments, the dummy gate electrode 503 may be formed by depositing a conductive material selected from a group comprising of polysilicon, W, Al, Cu, AlCu, W, Ti, TiAlN, TaC, TaCN, TaSiN, Mn, Zr, TiN, Ta, TaN, Co, Ni, combinations of these, or the like. The conductive material may be deposited by chemical vapor deposition (CVD), sputter deposition, or other techniques known and used in the art for depositing conductive materials. The thickness of the conductive material may be in the range of about 5 Å to about 500 Å. The top surface of the conductive material may have a non-planar top surface, and may be planarized using a process such as chemical mechanical planarization (CMP) prior to patterning of the dummy gate electrode 503 or gate etch. Ions may or may not be introduced into the dummy gate electrode 503 at this point. Ions may be introduced, for example, by ion implantation techniques.

Once the conductive material has been planarized, the dummy gate dielectric 501 and the dummy gate electrode 503 may be patterned. In an embodiment the patterning may be performed by initially forming a first hard mask 507 over the dummy gate electrode 503 and forming the second hard mask 509 over the first hard mask 507. According to some embodiments, the first hard mask 507 comprises a dielectric material such as silicon nitride (SiN), oxide, silicon oxide (SiO), titanium nitride (TiN), silicon oxynitride (SiON), combinations of these, or the like. The first hard mask 507 may be formed using a process such as chemical vapor deposition, plasma enhanced chemical vapor deposition, atomic layer deposition, or the like. However, any other suitable material and method of formation may be utilized. The first hard mask 507 may be formed to a thickness of between about 20 Å and about 3000 Å.

The second hard mask 509 comprises a separate dielectric material from the material of the first hard mask 507. The second hard mask 509 may comprise any of the materials and use any of the processes suitable for forming the first hard mask 507 and may be formed to a same or similar thickness as the first hard mask 507. In embodiments where the first hard mask 507 comprises silicon nitride (SiN), the second hard mask 509 may be e.g., an oxide. However, any suitable dielectric materials, processes and thicknesses may be used to form the second hard mask.

Once the first hard mask 507 and the second hard mask 509 have been formed, the first hard mask 507 and the second hard mask 509 may be patterned. In an embodiment the first hard mask 507 and the second hard mask 509 may be patterned by initially placing a photoresist (not individually illustrated) over the first hard mask 507 and the second hard mask 509 and exposing the photoresist to a patterned energy source (e.g., light) in order to initiate a chemical reaction that modifies the physical properties of the exposed portions of the first photoresist. The first photoresist may then be developed by applying a first developer in order to utilize the modified physical properties between the exposed region and the unexposed region to selectively remove either the exposed region or the unexposed region.

Once the photoresist has been patterned, the photoresist may be used as a mask in order to pattern the underlying first hard mask 507 and the second hard mask 509. In an embodiment the first hard mask 507 and the second hard mask 509 may be patterned using, e.g., one or more reactive ion etching (RIE) processes with the photoresist as a mask. The patterning process may be continued until the dummy gate electrode 503 is exposed beneath the first hard mask 507.

Once the first hard mask 507 and the second hard mask 509 have been patterned, the photoresist may be removed utilizing, e.g., an ashing process, whereby a temperature of the photoresist is raised until the photoresist experiences a thermal decomposition and may be easily removed using one or more cleaning process. However, any other suitable removal process may be utilized.

Once the photoresist has been removed, the dummy gate electrode 503 and the dummy gate dielectric 501 may be patterned using the first hard mask 507 and the second hard mask 509 in order to form a dummy gate stack 505. In an embodiment the dummy gate electrode 503 and the dummy gate dielectric 501 are patterned using an anisotropic etching process, such as a reactive ion etch, although any suitable process may be utilized.

Although not specifically illustrated in FIG. 5, a first spacer material may be formed by blanket deposition over the dummy gate stack 505 and exposed surfaces of the structure 100. As such, the first spacer material is deposited over the top surfaces and sidewalls of the dummy gate stack 505, the top surfaces and sidewalls of the fins 105 and the multilayer stacks 119, and top surfaces of the isolation regions 401. According to some embodiments, the first spacer material comprises a dielectric material and is formed using methods such as chemical vapor deposition (CVD), plasma enhanced CVD, sputter, thermal oxidation, and any other suitable methods. According to some embodiments, the first spacer material comprises materials such as silicon oxide ($SiO_2$), silicon oxynitride (SiON), silicon nitride ($Si_3N_4$), silicon oxycarbide (SiOC), silicon oxycarbonitride (SiOCN), although any suitable material, such as low-k materials with a k-value less than about 4.0, combination thereof, or the like may be utilized.

According to some embodiments, the first spacer material may be deposited and patterned into the gate spacers 905 (not illustrated in FIG. 5 but illustrated and described further below with respect to FIG. 9) as a single layer or as multiple layers. Any suitable number of spacer materials and any suitable combinations of deposition and removal processes may be used to form the gate spacers 905, and all such processes are fully intended to be included within the scope of the embodiments.

Once formed, the first spacer material may be patterned in order to shape a plurality of gate spacers 905 (shown in FIG. 9) along sidewalls of the dummy gate stack 505 and the fins 105 and to expose the tops of the second hard mask 509 and the portions of the fins 105 that are not covered by the dummy gate dielectric 501. According to some embodiments, the first spacer material may be patterned using an anisotropic etching process (e.g., a dry etching process) such as a reactive ion etching (RIE) process, an isotropic etching process (e.g., a wet etching process), combination thereof, or the like. In some embodiments, the first spacer material that is formed over the fins 105, in locations where source/drain regions 901 (shown in FIG. 9) are to be formed may be recessed during the patterning process and/or during a subsequent etching process. As such, top surfaces and portions of the sidewalls of the fins 105 may be re-exposed in those locations where the source/drain regions 901 are to be formed.

Once re-exposed, the materials of the fins 105 and multilayer stacks 119 between the gate spacers 905 are recessed to a desired depth to form openings in the locations for the eventual formation of source/drain regions 901. According to some embodiments, the fins 105 and multilayer stacks 119 are recessed to a depth that is level with tops of the isolation regions 401. In some other embodiments, the fins 105 and multilayer stacks 119 are recessed to a depth that is below the tops of the isolation regions 401. In some embodiments, the openings in the locations for the eventual formation of source/drain regions 901 may be formed to extend into the substrate 101 to a depth of between about 3 nm and about 40 nm. However, any suitable dimensions may be utilized for these openings. In some embodiments, the recesses in the fins 105 and multilayer stacks 119 may be formed using one or more anisotropic etches, such as reactive ion etches, although any suitable processes may be utilized.

At the sidewalls of these openings for the source/drain regions 901, optional inner spacers (not shown) may be formed in the first layers 121 of the multilayer stacks 119. The optional inner spacers may be formed by initially patterning recesses into the material of the first layers 121 exposed at the sidewalls of the openings for the source/drain regions 901. According to some embodiments, the recesses may be formed into the first layers 121 using a wet etch and an etchant that is more selective to the material of the first layers 121 (e.g., silicon germanium (SiGe)) than the material of the second layers 123 (e.g., silicon (Si)) or the substrate 101 (e.g., silicon (Si)). For example, in an embodiment in which the first layers 121 are silicon germanium and the second layers 123 are silicon, the wet etch may use an etchant such as hydrochloric acid (HCl). However, any suitable materials and etchants may be utilized.

In an embodiment the wet etching process may be a dip process, a spray process, a spin-on process, or the like and may be performed using any suitable process temperatures (e.g., between about 400° C. and about 600° C.) and any suitable process times (e.g., between about 100 seconds and about 1000 seconds, such as about 300 seconds). However, any suitable process conditions and parameters may be utilized. The etching process may be continued such that the recesses are formed in each of the first layers 121 to a desired distance from the sidewall of the openings. According to some embodiments, the recesses are formed in each of the first layers 121 with facet limited surfaces.

However, a wet etching process is not the only process that may be utilized to recess the first layers 121. For example, in another embodiment the recessing of the first layers 121 may be performed with an isotropic dry etching process or a combination of a dry etching process and a wet etching process. Any suitable process of recessing the first layers 121 may be utilized, and all such processes are fully intended to be included within the scope of the embodiments.

Once the recesses are formed in each of the first layers 121, a second spacer material may be formed over the structure 100. In some embodiments, the second spacer material can be different from the material of the gate spacers 905 and can be a dielectric material comprising silicon such as silicon nitride (SiN), silicon oxide ($SiO_2$), silicon oxynitride (SiON), silicon oxycarbonitride (SiOCN), silicon carbonitride (SiCN), silicon oxycarbide (SiOC), although any suitable material such as low-k materials with a k-value less than about 4.0, or even an air gap, or combination thereof may also be utilized. The second spacer material may be deposited using a deposition process such as chemical vapor deposition, physical vapor deposition, or atomic layer deposition to a thickness of between about 2 nm and about 10 nm. However, any suitable thickness or deposition process may be utilized.

By depositing the second spacer material over the structure 100, the second spacer material will line the sidewalls of the openings formed in the locations for the source/drain regions 901 and will also fill in the recesses in the first layers 121. Once the recesses have been filled with the second spacer material, a removal process is then performed to remove any excess second spacer material from the openings, while leaving behind the optional inner spacers. In an embodiment, the removal of the excess second spacer material may be performed using an etching process such as, e.g., an anisotropic, dry etching process such as a reactive ion etching process. However, any suitable etching process, which removes the excess second spacer material from the openings while leaving behind the optional inner spacers, may be utilized.

By filling the recesses with the second spacer material and removing the excess second spacer material from the openings, the optional inner spacers will take on the shape of the recesses. Any suitable shape, such as a concave shape or a convex shape, or even the optional inner spacers being recessed may be utilized. All such shapes are fully intended to be included within the scope of the embodiments. According to some embodiments, the optional inner spacers may be formed to a width of between about 2 nm and about 10 nm and a height of between about 5 nm and about 20 nm. Furthermore, the optional inner spacers may be spaced apart by a distance of between about 3 nm and about 10 nm. However, any suitable widths, heights, and distances may be utilized.

Once the openings and/or the optional inner spacers have been formed, the source/drain regions 901 may be formed in the openings. The source/drain regions 901 may be formed using a growth process such as a selective epitaxial process with a semiconductor material suitable for the device desired to be formed. For example, in an embodiment in which the source/drain regions 901 are utilized to form an NMOS device, the source/drain regions 901 may be a semiconductor material such as silicon, silicon phosphorous, silicon carbon phosphorous, combinations, of these, or the like.

The epitaxial growth process may use precursors such as silane, dichlorosilane, germane, and the like, and may continue for between about 5 minutes and about 120 minutes. According to some embodiments, the source/drain regions 901 are formed to a height of between about 30 nm and about 90 nm. However, any suitable heights and/or suitable depths may be used. Furthermore, according to some embodiments, the epitaxial growth may be grown beyond the original dimensions of the fins 105 and/or the multilayer stacks 119. As such, according to some embodiments, the epitaxial growth associated with one of the fins 105 or associated with one of the multilayer stacks 119 may grow together with the epitaxial growth associated with another one of the fins 105 or associated with another one of the multilayer stacks 119. Furthermore, one or more of the epitaxial growths associated with the device region 120, the first multi-channel device region 130, and/or the second multi-channel device region 140 may be grown together to form a single epitaxial growth region. However, they may also be grown to form separate epitaxial growth regions.

Once the source/drain regions 901 are formed, dopants may be implanted into the source/drain regions 901 by implanting appropriate dopants to complement the dopants within the remainder of the first device region. For example, n-type dopants such as phosphorous (P), carbon (C), arsenic (As), silicon (Si), antimony (Sb), or the like, and combinations thereof (e.g., SiP, SiC, SiPC, SiAs, Si, Sb, etc.) may be implanted to form NMOSFET devices. These dopants may be implanted using the dummy gate stack 505 and the gate spacers 905 as masks.

In another embodiment, the dopants of the source/drain regions 901 may be placed during the epitaxial growth of the source/drain regions 901. For example, phosphorous may be placed in situ as the source/drain regions 901 are being formed. Any suitable process for placing the dopants within the source/drain regions 901 may be utilized, and all such processes are fully intended to be included within the scope of the embodiments. Furthermore, an anneal process may be performed to activate the dopants within the source/drain regions 901. During the anneal process, dopants of the source/drain regions 901 may laterally diffuse into the second layers 123 at the interfaces between the second layers 123 and the source/drain regions 901. As such, lightly doped drain (LDD) regions may be formed within the second layers 123.

Once the source/drain regions 901 have been formed, a contact etch stop layer 903 (shown in FIG. 9) may be formed over the source/drain regions 901 and other exposed surfaces of the structure 100. The contact etch stop layer 903 functions as an etch stop layer in a subsequent etching process, and may comprise a suitable material such as silicon nitride (SiN), silicon oxynitride (SiON), silicon carbon nitride (SiCN), combinations thereof, or the like. The contact etch stop layer 903 may be formed by a suitable deposition method such as a chemical vapor deposition (CVD), a physical vapor deposition (PVD), a combinations thereof, or the like.

Once the contact etch stop layer 903 is formed, an interlayer dielectric layer 907 (shown in FIG. 9) is formed over the contact etch stop layer 903. According to some embodiments, the interlayer dielectric layer 907 comprises a material such as silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof, although any suitable dielectrics may be used. The interlayer dielectric layer 907 may be formed using a process such as plasma enhanced chemical vapor deposition (PECVD), although other processes, such as low pressure chemical vapor deposition (LPCVD), may also be used.

Once formed, the interlayer dielectric layer 907 and the contact etch stop layer 903 may be planarized with the dummy gate electrode 503 and gate spacers 905 using a planarization process such as chemical mechanical planarization (CMP). However, any suitable planarization process may be utilized. Furthermore, the first hard mask 507 and the second hard mask 509 may be removed during the planarization process. According to some embodiments, one or more etching processes and/or the chemical mechanical planarization (CMP) may be utilized to remove the first hard mask 507 and the second hard mask 509. As such, the dummy gate electrode 503 is exposed after the removal of the first hard mask 507.

Figure 6:
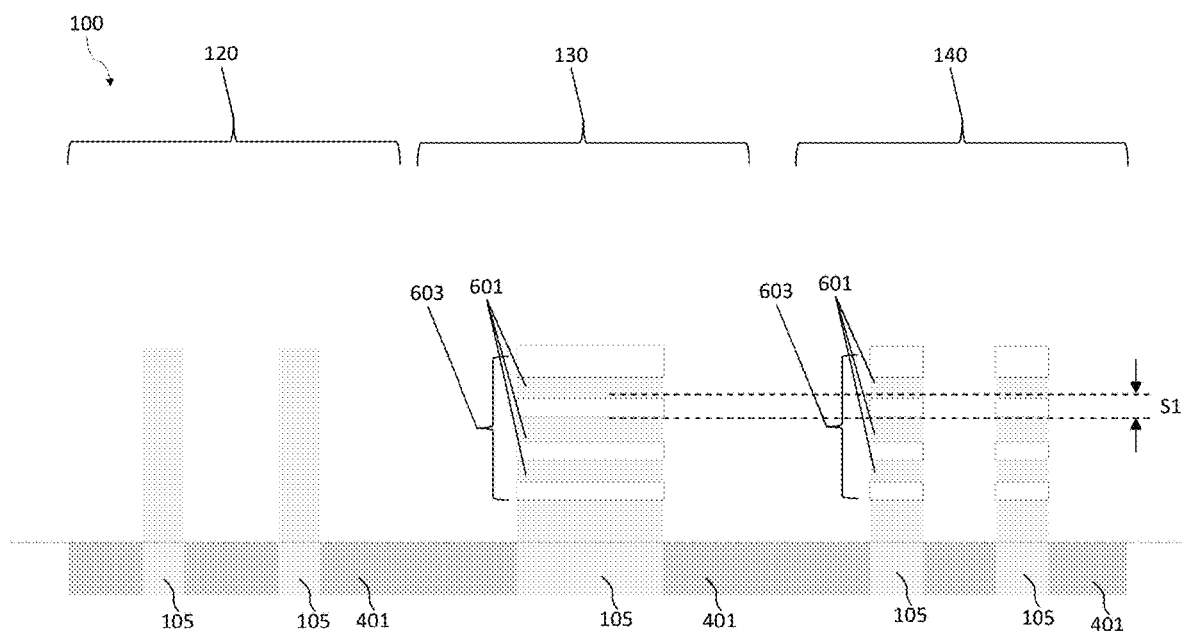
FIG. 6 illustrates a cross-sectional view of an intermediate structure after performing a removal of a dummy gate electrode, the dummy gate dielectric, and second layers of the multilayer stacks in a wire-release process, in accordance with some embodiments.

Turning to FIG. 6, this figure illustrates the removal of the dummy gate electrode 503 and the dummy gate dielectric 501. FIG. 6 further illustrates a removal of the second layers 123 in a wire-release process, according to some embodiments. In an embodiment, once exposed, the dummy gate electrode 503 may be removed in order to expose the underlying dummy gate dielectric 501. In an embodiment the dummy gate electrode 503 is removed using, e.g., one or more wet or dry etching process that utilize etchants that are selective to the material of the dummy gate electrode 503. However, any suitable removal process may be utilized.

Once the dummy gate dielectric 501 has been exposed, the dummy gate dielectric 501 may be removed. In an embodiment the dummy gate dielectric 501 may be removed using, e.g., a wet etching process. However, any suitable etching process may be utilized.

FIG. 6 further shows that, once the dummy gate dielectric 501 has been removed (which also exposes the sides of the first layers 121), the first layers 121 may be removed from between the second layers 123 in a wire release process step. The wire release process step may also be referred to as a sheet release process step, a sheet formation process step, a nanosheet formation process step or a wire formation process step. In an embodiment the first layers 121 may be removed using a wet etching process that selectively removes the material of the first layers 121 (e.g., silicon germanium (SiGe)) without significantly removing the material of the fins 105 (e.g., silicon (Si)) and the material of the second layers 123 (e.g., silicon (Si)). However, any suitable removal process may be utilized.

For example, in an embodiment, an etchant such as a high temperature HCl may be used to selectively remove the material of the first layers 121 (e.g., SiGe) without substantively removing the material of the fins 105 and/or the material of the second layers 123 (e.g., Si). Additionally, the wet etching process may be performed at a temperature of between about 400° C. and about 600° C., and for a time of between about 100 seconds and about 600 seconds. However, any suitable etchant, process parameters, and time can be utilized.

By removing the material of the first layers 121, the sides of the second layers 123 (relabeled nanostructures 601 in FIG. 6) are exposed. The nanostructures 601 are arranged in nanostructure stacks 603 and are separated from each other by the optional inner spacers that are formed, as described above, in the recesses of the first layers 121. The optional inner spacers prevent the nanostructures 601 from crashing during the wire-release process. According to some embodiments, the nanostructures 601 are separated by a first spacing 51 of between about 3 nm and about 20 nm. The nanostructures 601 comprise the channel regions that extend between source/drain regions 901 that are formed at distal ends of the nanostructures 601. The nanostructures 601 may have a channel length of between about 5 nm and about 180 nm. In an embodiment the nanostructures 601 are formed to have the same thicknesses as the original thicknesses of the second layers 123 such as between about 3 nm and about 15 nm, although the etching processes may also be utilized to reduce the thicknesses of the second layers 123.

Figure 7A:
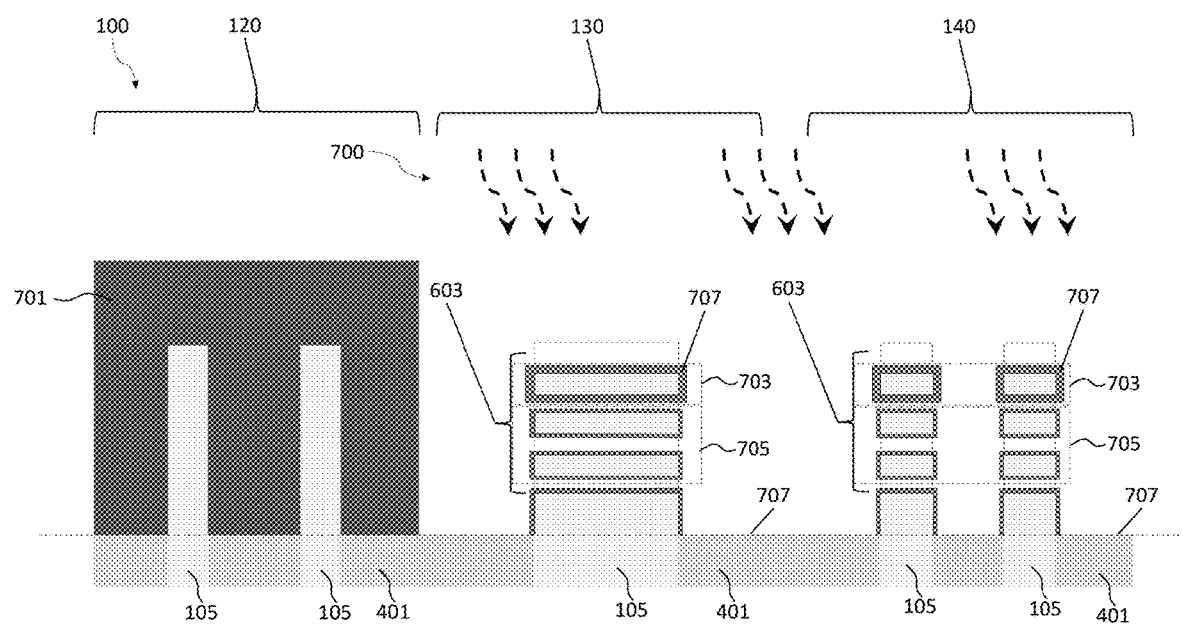
FIGS. 7A and 7B illustrate cross-sectional views of a first interface treatment performed on the intermediate structure of FIG. 6, in accordance with some embodiments.
Figure 7B:
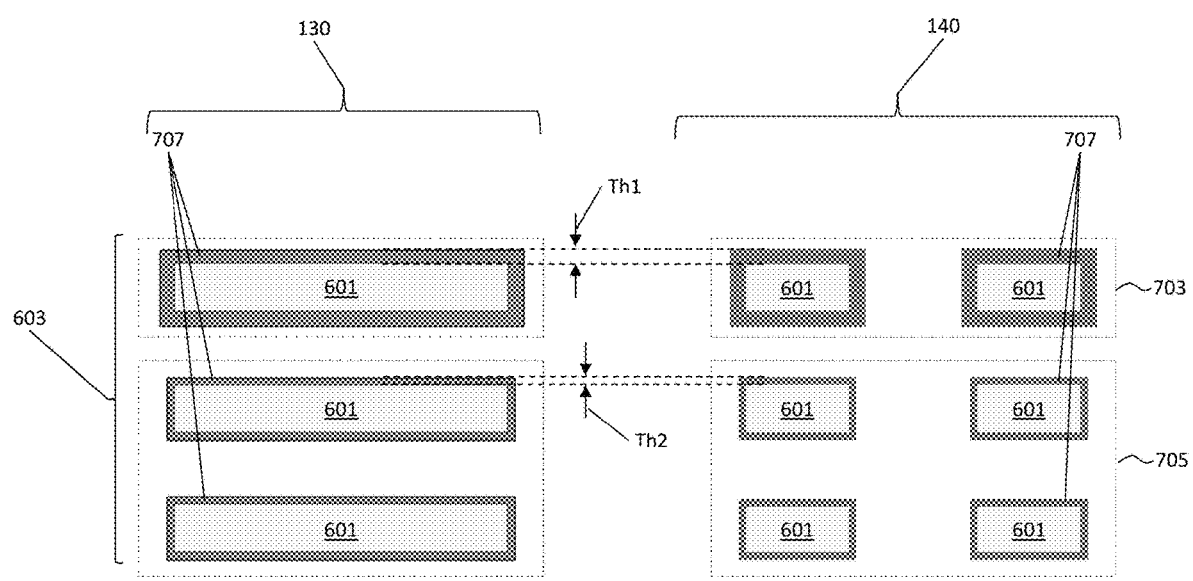

FIGS. 7A and 7B illustrate a first interface treatment 700, in accordance with a first embodiment, for the formation and interface tuning of first gate dielectric layers 707 over the nanostructures 601 and the exposed surfaces of the fins 105. According to some embodiments, the device region 120 may be protected by a protective material 701 (e.g., photoresist) during the first interface treatment 700. Once the device region 120 is protected, the first interface treatment 700 is performed on the first multi-channel device region 130 and the second multi-channel device region 140. In some embodiments, the first interface treatment 700 comprises a selective tuning treatment followed by a wet clean treatment and deposition of a gate dielectric material.

The first interface treatment 700 may be used to control the formation and thicknesses of the first gate dielectric layers 707 of the topmost channels 703 and the remaining channels 705 of the nanostructure stacks 603. According to some embodiments, the selective tuning treatment is performed using a dry etch process such as a plasma etch, a remote plasma etch, a chemical etch, combinations or the like. The selective tuning treatment is performed using a first precursor (e.g., passivation gas) and a second precursor (e.g., diluent gas) for the selective tuning of the nanostructures 601 in the nanostructure stacks 603. The first precursor includes, but is not limited to, gases such as $N_2$, $O_2$, $CO_2$, $SO_2$, CO, $SiCl_4$, $H_2$, combinations, or the like. The second precursor includes, but is not limited to, inert gases such as Ar, He, Ne, combinations, or the like. The selective tuning treatment is performed using a plasma source power of between about 10 W and about 3000 W and a plasma bias power of between about 0 W and about 3000 W. According to some embodiments, the selective tuning treatment may be performed at a process pressure between about 1 mTorr and about 10 Torr. Furthermore, the selective tuning treatment may be performed using a process flow rate of between about 1 sccm and about 5000 sccm in accordance with some embodiments.

In another embodiment the first interface treatment 700 is a wet etching process such as a wet cleaning process that can be performed instead of or in addition to the dry etch process described above. In some embodiments, the wet etching process is performed using an etch assistant and a solvent in a process such as a dip process, a spray process, a spin-on process, or the like. The etch assistant can be used to aid in the selective tuning of the thicknesses of the first gate dielectric layers 707. According to some embodiments, the etch assistant includes, but is not limited to, chemicals such as $H_2SO_4$, $O_3$, $NH_3$, combinations or the like. The solvent is used to transport the etch assistant during the wet clean treatment. According to some embodiments, the solvent includes, but is not limited to, deionized water, alcohol, acetone, combinations, or the like.

Once the wet clean process has been performed, a gate dielectric deposition treatment is performed according to some embodiments. The gate dielectric deposition treatment uses materials such as SiN, SiON, SiCON, SiC, SiOC, $SiO_2$, combinations or the like to form the first gate dielectric layer 707 over the surfaces of the nanostructures 601 and the fins 105 of the nanostructure stacks 603. According to some embodiments, the gate dielectric deposition treatment may be performed using a deposition process such as chemical vapor deposition (CVD), atomic layer deposition (ALD), combinations, or the like.

FIG. 7B illustrates a magnified view of the first gate dielectric layers 707, in accordance with the first embodiment, formed over the nanostructure stacks 603 in the first multi-channel device region 130 and in the second multi-channel device region 140. According to the first embodiment, the first gate dielectric layers 707 are formed as native oxide layers by simply exposing the structure to an ambient environment comprises oxygen, such as air. In other embodiments the first gate dielectric layers 707 may be formed using one or more deposition processes, such as ALD, CVD, PVD, combinations of these, or the like.

Furthermore, by controlling a number of deposition cycles and/or a time of deposition for each of the deposition cycles for the first interface treatment 700, a non-conformal treatment may be applied. As such, the first gate dielectric layers 707 are formed to a first thickness Th1 at the interfaces of the topmost channels 703 and the first gate dielectric layers 707 are formed to a second thickness Th2 at the interfaces of the remaining channels 705, the first thickness Th1 being greater than the second thickness Th2. The first interface treatment 700 may be performed in a single deposition cycle or may be performed using multiple deposition cycles. According to some embodiments, the number of deposition cycles performed for the first interface treatment 700 may be between about 1 deposition cycle and about 500 deposition cycles. In some embodiments, the time of deposition for each deposition cycle may be between about 0.2 seconds/cycle and about 100 seconds/cycle. The number of deposition cycles and the time of deposition for each deposition cycle may also be dependent on a volume of the chamber being utilized. For instance, in a chamber having a smaller volume a steady state of the deposition may be reached relatively quickly (e.g., less than about 10 seconds) as compared to the time required to reach a steady state of the deposition (e.g., between about 10 seconds and about 100 seconds) in a chamber having a larger volume. In accordance with some embodiments, the first thickness Th1 of the first gate dielectric layers 707 is between about 3 Å and about 60 Å. Furthermore, the second thickness Th2 is between about 3 Å and about 50 Å, in accordance with some embodiments.

Once the first interface treatment 700 has been completed, the protective material 701 may be removed from over the device region 120. According to some embodiments, the protective material 701 may be removed by a suitable removal process. For example, in an embodiment in which the protective material 701 is a photoresist, an ashing technique and cleaning process may be utilized to remove the protective material 701. However, any suitable removal process may be utilized.

Figure 8:
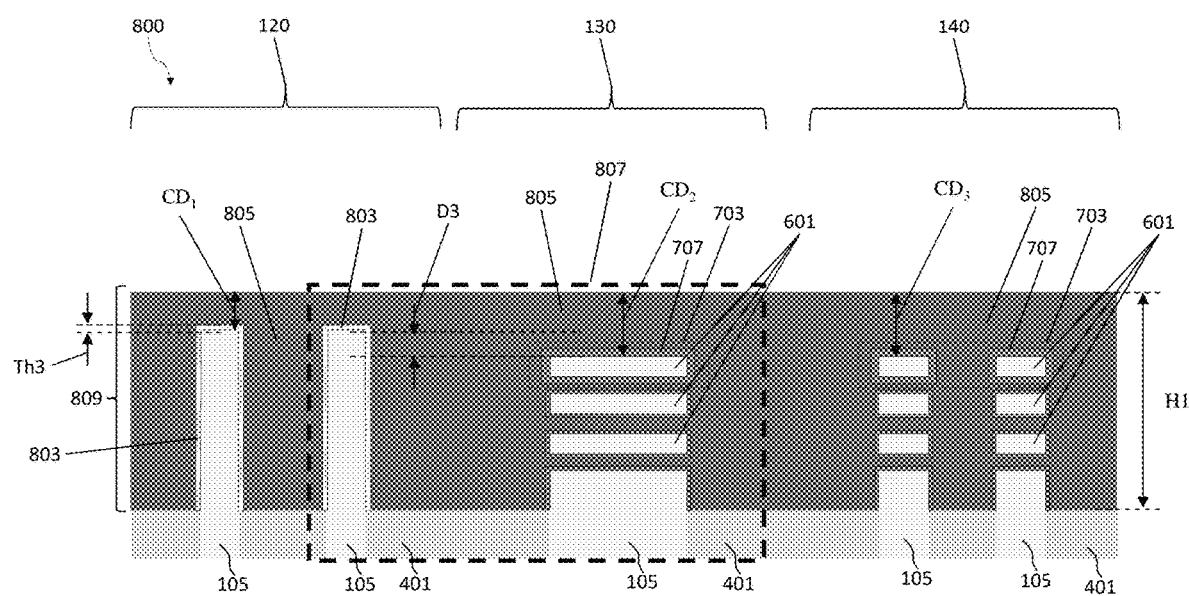
FIG. 8 illustrates a cross-sectional view of the integrated circuit device, in accordance with some embodiments.

Turning to FIG. 8, this figure illustrates the formation of a second gate dielectric 803 and a gate electrode 805 of an integrated circuit device 800. FIG. 8 further illustrates a section 807 of the integrated circuit device 800. According to some embodiments, the second gate dielectric 803 is formed over the fins 105 in the device region 120 by initially providing a protection layer over the first multi-channel device region 130 and the second multi-channel device region 140. According to some embodiments, the protection layer may be formed using any of the materials and processes suitable for forming the protection material 701 as set forth above. However, any other suitable materials and processes may be used to form the protection layer.

Once the first multi-channel device region 130 and the second multi-channel device region 140 have been protected, the second gate dielectric 803 may be formed over the fins 105 of the device region 120. The second gate dielectric 803 may be formed using any of the materials and processes used to form the first gate dielectric layer 707, e.g., a deposition process. According to some embodiments, the second gate dielectric 803 may be formed to have the same material composition as the first gate dielectric layer 707. In other embodiments, material of the second gate dielectric 803 is different from the material of the first gate dielectric layer 707.

In an embodiment, the second gate dielectric 803 is deposited conformally over the fins 105 of the device region 120, such as on the top surfaces and the sidewalls of the fins 105. The second gate dielectric 803 may also be formed on the top surface of the interlayer dielectric layer 907 (shown in FIG. 9). In accordance with some embodiments, the second gate dielectric 803 comprises silicon oxide, silicon nitride, or multilayers thereof. In some embodiments, the second gate dielectric 803 includes a high-k dielectric material (e.g., a k value greater than about 7.0) and may include a metal oxide or a silicate of hafnium, aluminum, zirconium, lanthanum, manganese, barium, titanium, lead, and combinations thereof. The formation methods of the second gate dielectric 803 may include ALD, PECVD, Molecular-Beam Deposition (MBD), and the like. However, any suitable materials and methods of formation may be utilized to form the second gate dielectric 803. According to some embodiments, the second gate dielectric 803 is formed to a third thickness Th3 over the fins 105 in the device region 120. In accordance with some embodiments, the first thickness Th1 is between about 0 Å and about 80 Å. However, any suitable thickness may be used for the second gate dielectric 803. Once the second gate dielectric 803 has been formed, the protection layer may be removed from over the first multi-channel device region 130 and the second multi-channel device region 140.

Figure 9:
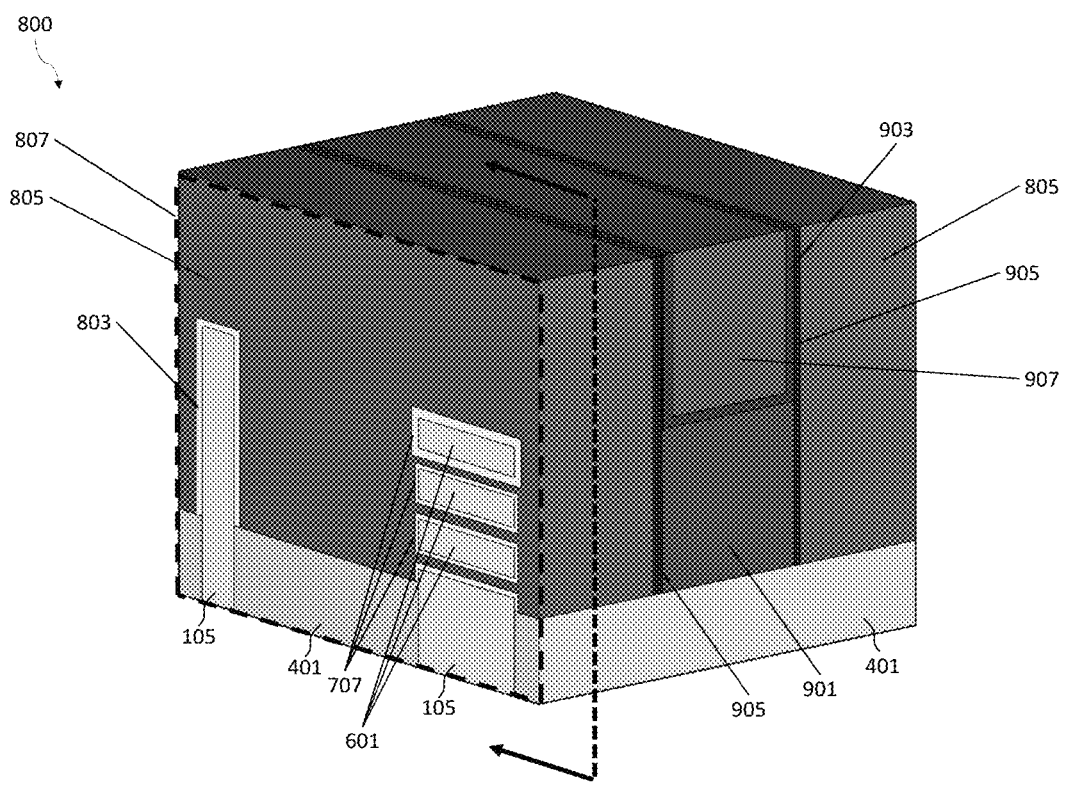
FIG. 9 illustrates a perspective view of a section of the integrated circuit device shown in FIG. 8, in accordance with some embodiments.

The gate electrode 805 is formed over the second gate dielectric 803 of the device region 120 and over and surrounding the first gate dielectric layer 707 of the first multi-channel device region 130 and the second multi-channel device region 140. The gate electrode 805 may include a metal-containing material such as titanium nitride, titanium oxide, tantalum nitride, tantalum carbide, cobalt, ruthenium, aluminum, tungsten, combinations thereof, or multi-layers thereof. For example, although a single layer is illustrated in FIGS. 8 and 9 for the gate electrode 805, the gate electrode 805 may comprise any number of liner layers, any number of work function tuning layers, and/or a fill material. After the materials of the gate electrode 805 have been deposited, a planarization process, such as a CMP, may be performed to remove the excess portions of the second gate dielectric 803, the first gate dielectric layer 707, and the material of the gate electrode 805, which excess portions are over the top surface of the interlayer dielectric layer 907. According to some embodiments, the gate electrode 805 may be formed to a first height H1 of between about 20 nm and about 280 nm. However, any suitable height may be used for the gate electrode 805.

The gate electrode 805, the first gate dielectric layer 707, and the second gate dielectric 803 thus collectively form, according to some embodiments, a single replacement gate (e.g., a shared gate electrode) of a resulting active component (e.g., FinFET device or the like) and resulting multi-channel devices (e.g., an NSFET device, a GAAFET device, or the like) of the integrated circuit device 800. The gate electrode 805, the first gate dielectric layer 707 and the second gate dielectric 803 may be collectively referred to as a shared gate stack 809.

FIG. 8 further illustrates the shared gate stack 809 comprises a first critical dimension $CD_1$ located over the fins 105 in the device region 120. According to some embodiments, the first critical dimension $CD_1$ may be a distance of between about 10 Å and about 500 Å.

FIG. 8 further illustrates the shared gate stack 809 comprises a second critical dimension $CD_2$ located over the topmost channels 703 in the first multi-channel device region 130 and a third critical dimension $CD_3$ located over the topmost channels 703 in the second multi-channel device region 140. The second critical dimension $CD_2$ and the third critical dimension $CD_3$ are greater than the first critical dimension $CD_1$. According to some embodiments, the second critical dimension $CD_2$ and the third critical dimension $CD_3$ may each be a distance of between about 15 Å and about 500 Å. In some embodiments, the third critical dimension $CD_3$ may be about the same as the second critical dimension $CD_2$; however, they may also be different.

FIG. 9 illustrates a perspective view of the section 807 of the integrated circuit device 800, in accordance with some embodiments. In accordance with a particular embodiment, FIG. 9 illustrates one of the fins 105 of the device region 120 and one of the fins 105 of the first multi-channel device region 130 separated by the isolation regions 401. FIG. 9 further illustrates the first gate dielectric layer 707, the second gate dielectric 803, and the gate electrode 805 over the first gate dielectric layer 707 and the second gate dielectric 803. FIG. 9 further illustrates one of the source/drain regions 901, the gate spacers 905, the contact etch stop layer 903, and the interlayer dielectric layer 907 over the isolation regions 401 and separating a first instance of the gate electrode 805 from a second instance of the gate electrode 805 in the integrated circuit device 800.

Figure 10:
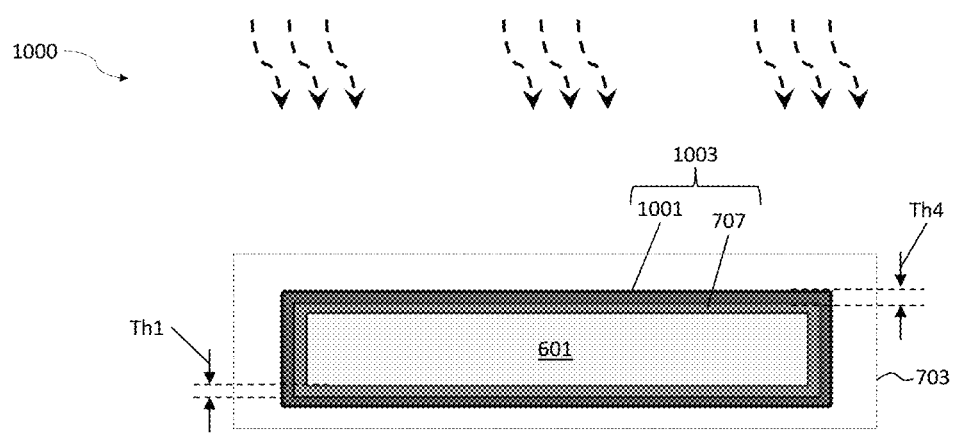
FIG. 10 illustrates a cross-sectional view of a second interface treatment performed on the intermediate structure of FIG. 6, in accordance with some embodiments.

Turning to FIG. 10, this figure illustrates a gate dielectric deposition process 1000, according to some embodiments. The gate dielectric deposition process 1000 may be performed in combination with or separate from the first interface treatment 700 to form an outer gate dielectric layer 1001 over and surrounding the first gate dielectric layer 707 of the topmost channels 703. As such, a complex gate dielectric layer 1003 is formed surrounding the nanostructures 601 of the topmost channels 703.

The outer gate dielectric layer 1001 may be formed using materials such as SiN, SiON, SiCON, SiC, SiOC, combinations, or the like, in accordance with some embodiments. However, any suitable materials may be used. The outer gate dielectric layer 1001 may be formed over the first gate dielectric layer 707 to a fourth thickness Th4 using a deposition method such as a chemical vapor deposition (CVD), an atomic layer deposition (ALD), combinations, or the like. In some embodiments, the fourth thickness Th4 is between about 3 Å and about 50 Å. According to some embodiments, a sum of the first thickness Th1 of the first gate dielectric layer 707 and the fourth thickness Th4 of the outer gate dielectric layer 1001 is between about 6 Å and about 110 Å. However, any suitable method of deposition and thicknesses may be used to form the outer gate dielectric layer 1001.

Figure 11A:
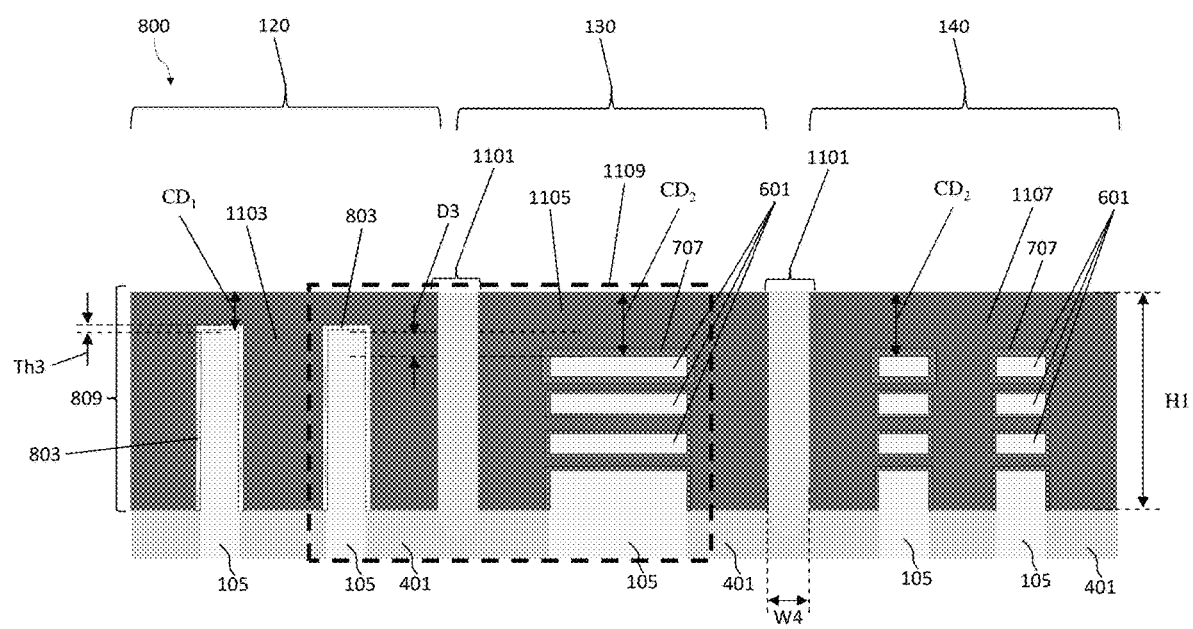
FIG. 11A illustrates a cross-sectional view of the integrated circuit including cut-metal gate structures, according to some embodiments.

FIG. 11A illustrates, in a cross-sectional view, the integrated circuit device 800 including two cut-metal gate structures 1101 according to some other embodiments. The cut-metal gate structures 1101 divide the shared gate stack 809 into a plurality of isolated gate stack structures including a first isolated gate stack 1103 of the device region 120, a second isolated gate stack 1105 of the first multi-channel device region 130, and a third isolated gate stack 1107 of the second multi-channel device region 140. Although two of the cut-metal gate structures 1101 are illustrated in FIG. 11A, any suitable number of cut-metal gate structures 1101 may be formed to separate the shared gate stack 809 into any suitable number or any suitable combination of isolated gate structures and/or shared gate structures. For example, the shared gate stack 809 may be divided into the first isolated gate stack 1103 of the device region 120 and a shared gate stack structure over the first multi-channel device region 130 and the second multi-channel device region 140 by forming one of the cut-metal gate structures 1101 at the interface between the device region 120 and the first multi-channel device region 130. In another example, the shared gate stack 809 may be divided into the third isolated gate stack 1107 of the second multi-channel device region 140 and a shared gate stack structure over the device region 120 and the first multi-channel device region 130 by forming one of the cut-metal gate structures 1101 at the interface between the first multi-channel device region 130 and the second multi-channel device region 140. FIG. 11A further illustrates a second section 1109 of the integrated circuit device 800 that is highlighted with a dashed line and includes the cut-metal gate structure 1101 at the interface between the device region 120 and the first multi-channel device region 130.

Figure 11B:
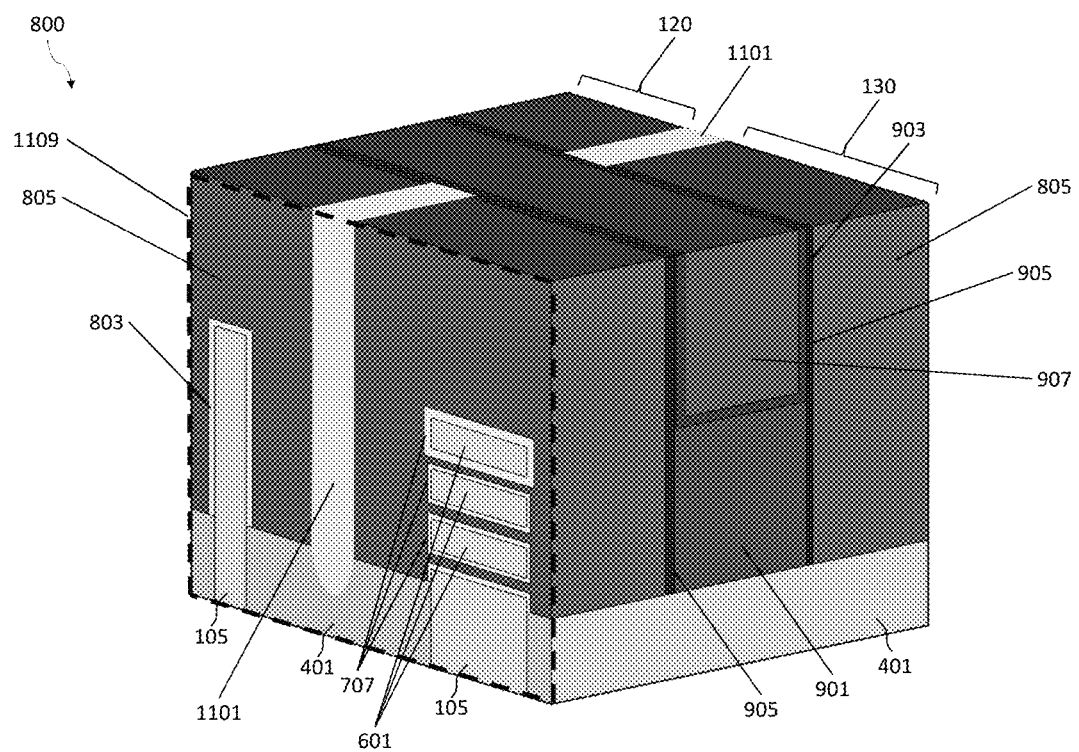
FIG. 11B illustrates a perspective view of a section of the integrated circuit illustrated in FIG. 11A, according to some embodiments.

FIG. 11B illustrates, in a perspective view, the second section 1109 of the integrated circuit device 800 illustrated in FIG. 11A. In particular, FIG. 11B illustrates the cut-metal gate structure 1101 located at the interface between the device region 120 and the first multi-channel device region 130, in accordance with some embodiments.

The cut-metal gate structures 1101 may be formed by initially depositing a masking layer over the planar surfaces of the gate electrode 805, the interlayer dielectric layer 907, the contact etch stop layer 903, and the gate spacers 905. Once deposited, the masking layer is patterned to expose the underlying materials in desired locations of the cut-metal gate structures 1101 that are to be formed.

Once patterned, the masking layer is used as an etching mask to etch the underlying materials to form second openings (e.g., trenches, recesses, channels or the like) in the desired locations of the cut-metal gate structures 1101 (e.g., at the interface between the device region 120 and the first multi-channel device region 130). In the etching process, the materials of the gate electrodes 805, the gate spacers 905, the contact etch stop layer 903, and/or the interlayer dielectric layer 907 are etched using one or more anisotropic etching processes, and may stop on the top surface of the first gate dielectric layers 707, the second gate dielectric 803, or the isolation regions 401. According to some embodiments, between source/drain regions 901 of adjacent devices (e.g., the device region 120 and the first multi-channel device region 130) the etching process may be continued to etch the second openings into but not through the isolation regions 401. In still further embodiments, between source/drain regions 901 of adjacent devices the etching process may be continued to etch the second openings through the isolation regions 401 and into the substrate 101. The second openings may be formed to cut through one or more gate electrodes 805. According to some embodiments, the second openings divide the gate spacers 905 and the interlayer dielectric layer 907 into two separate gate spacers 905 and two separate interlayer dielectric layers 907 of two neighboring devices (e.g., the device region 120 and the first multi-channel device region 130). Once the second openings have been formed, the masking layer is removed.

Once the second openings have been formed, the cut-metal gate structures 1101 are formed by initially depositing a dielectric material 1111 to fill and overfill the second openings. In accordance with some embodiments, the cut-metal gate structures 1101 are formed using a dielectric material such as a silicon nitride (SiN), oxide (OX), silicon oxynitride (SiON), silicon oxycarbonitride (SiOCN), silicon carbonitride (SiCN), or the like. According to some embodiments, the cut-metal gate structures 1101 are formed using a metal oxide of materials such as zirconium (Zr), hafnium (Hf), aluminum (Al), or the like. Furthermore, the cut-metal gate structures 1101 may be formed using a suitable deposition process such as chemical vapor deposition (CVD), atomic layer deposition (ALD), physical vapor deposition (PVD), combinations of these, or the like. However, any suitable materials and deposition processes may be utilized. According to some embodiments, the cut-metal gate structures 1101 are formed to a fourth width W4 of between about 5 nm and about 50 nm. However, any suitable widths may be used.

The cut-metal gate structures 1101 divide the shared gate stack 809 which is relatively long into a plurality of gate electrodes which are relatively short and isolate the plurality of gate electrodes from one another. Furthermore, the excess dielectric material of the cut-metal gate structures 1101 outside of the second openings may be planarized with the gate electrodes 805, the gate spacers 905, the contact etch stop layers 903, and the interlayer dielectric layers 907 using a process such as chemical mechanical planarization (CMP).

According to some further embodiments, optional cut-dummy-gate structures (not shown) may be formed instead of or in addition to the cut-metal-gate structures 1101. In some embodiments, the optional cut-dummy-gate structures may be formed using a dummy fin (not shown) located between one or more of the device region 120, the first multi-channel device region 130 and the second multi-channel device region 140. In still further embodiments, the optional cut-dummy-gate structures may be formed without using a dummy fin.

With reference back to FIGS. 1-2, the optional cut-dummy-gate structures may be formed by initially forming a sacrificial fin (not shown) between one or more of the device region 120, the first multi-channel device region 130 and the second multi-channel device region 140 according to some embodiments. The sacrificial fins may be formed similar to the fins 105 formed in the device region 120, the multilayer stack 119 and the fin 105 formed in the first multi-channel region 130, the multilayer stacks 119 and the fins 105 formed in the second multi-channel region 140, combinations, or the like.

With reference to FIG. 2, once the sacrificial fins (not shown) have been formed, the isolation material 107 is deposited over and planarized with the sacrificial fins and the fins 105 formed in the device region 120, the multilayer stack 119 and the fin 105 formed in the first multi-channel region 130, the multilayer stacks 119 and the fins 105 formed in the second multi-channel region 140 similar to the process disclosed above. Once the isolation material 107 has been formed, the sacrificial fins (not shown) may be removed and replaced with a dummy fin (also not shown). In such embodiments, at least a portion of the sacrificial fin is removed using one or more acceptable etching processes, for example. Thus, an opening is formed in the isolation material 107 between one or more of the device region 120, the first multi-channel device region 130 and/or the second multi-channel device region 140. In some embodiments, the sacrificial fin may be completely removed and in other embodiments, a portion of the sacrificial fin may remain at a bottom and exposed within the opening. Once the sacrificial fin has been removed, in subsequent processes, the dummy fin is formed in the opening.

According to some embodiments, the dummy fin may comprise one or more layers of a silicon-based material (e.g., SiN, SiON, SiOCN, SiC, SiOC, $SiO_2$, or the like), a metal-based material (e.g., a metal oxide, metal nitride, or the like such as TaN, TaO, HfO, or the like), and/or the like. The dummy fin may be a single material or may comprise multiple layers of materials, which may be stacked vertically and/or horizontally. In some embodiments, a width of the dummy fin may be in the range of about 5 Å to about 500 Å.

The dummy fin may be formed using one or more deposition processes, such as CVD, plasma enhanced CVD (PECVD), plasma enhanced ALD (PEALD), ALD, PVD, or the like. In embodiments where the dummy fin comprises multiple layers of materials, forming the dummy fin may also include one or more etch back and/or planarization steps before additional material layer(s) of the dummy fin are deposited. Further, the dummy fin may be deposited to initially cover the isolation material 107, and a planarization, etch back, or the like process may be used to remove excess portions of the dummy fin and expose the isolation material 107.

With further reference to FIG. 2, other methods of forming the dummy fin are also possible without initially forming a sacrificial fin. In still further embodiments, the isolation material 107 may be deposited using a conformal process, which only partially fills a space between the fins 105 of the device region 120, the fin 105 of the first multi-channel device region 130, and/or the second multi-channel device region 140. As a result of the conformal deposition process, an opening is defined in the partially filled space and over the isolation material 107. One or more materials and processes for forming the dummy fin may be used to subsequently fill in the opening defined in the partially filled space and planarize the dummy fin with the isolation material 107. As such, the dummy fin may be disposed between the fins 105 of the device region 120, the fin 105 of the first multi-channel device region 130, and/or the second multi-channel device region 140 and the dummy fin may be embedded in the isolation material 107. For example, the isolation material 107 may contact a bottom surface and sidewalls of the dummy fin.

With further reference to FIGS. 3 and 4, once the dummy fin (not shown) has been formed using one of the methods discussed above, the isolation material 107 is etched back to define the STI regions 401. As such, the dummy fin, the fins 105 of the device region 120, the fin 105 of the first multi-channel device region 130, and/or the second multi-channel device region 140 are exposed above the STI regions 401. Etching back the isolation material 107 may be performed using a similar process and using one or more precursors as described above with respect to FIG. 4, the one or more precursors being relatively selective to the isolation material 107 and relatively non-selective to the materials of the dummy fin. Accordingly, a method of forming the dummy fin may be completed according to alternative embodiments.

With reference now to FIG. 5 for embodiments comprising a dummy fin (not shown), the dummy gate dielectric 501 may be formed over the exposed surfaces of the dummy fin in addition to being formed over the fins 105 of the device region 120, the fin 105 of the first multi-channel device region 130, and/or the second multi-channel device region 140. Once the dummy gate dielectric 501 is formed, the dummy gate electrode 503, the first hard mask 507, and the second hard mask 509 are formed over the dummy gate dielectric 501 and patterned into the dummy gate stacks 505, as set forth above. Furthermore, once the dummy gate stacks 505 have been formed, the plurality of gate spacers 905 (shown in FIG. 9) may be patterned along sidewalls of the dummy gate stacks 505, as discussed above. Once the gate spacers 905 have been patterned, the source/drain regions 901, the contact etch stop layers 903, and the interlayer dielectric layers 907 may be formed and planarized with the dummy gate electrode 503, as discussed above.

With further reference to FIG. 5 for embodiments comprising a dummy fin (not shown), an opening (also not shown) may be formed in the dummy gate electrode 503. In some embodiments, the opening may be aligned with and disposed directly over the dummy fin. The opening may be formed in the dummy gate electrode 503 through a combination of photolithography and etching, for example. The opening may expose sidewalls of the gate spacers 905. Furthermore, a depth of the opening extending into the dummy gate electrode 503 may be controlled by tuning one or more parameters (e.g., etch time, or the like) of the etching process used to form the opening.

In some embodiments, etching the opening in the dummy gate electrode 503 includes a plasma process, such as a plasma etch, a remote plasma process, a radical etch, or the like. An etching gas used during the plasma process may comprise $Cl_2$, HBr, $CF_4$, $CHF_3$, $CH_2F_2$, $CH_3F$, $C_4F_6$, $BCl_3$, $SF_6$, $H_2$, combinations thereof, or the like. The plasma process may further include flowing a passivation gas over the structure 100 for tuning (e.g., increasing) etch selectivity between the dummy gate electrode 503 and other features of the structure 100. Embodiment passivation gases may comprise $N_2$, $O_2$, $CO_2$, $SO_2$, CO, $SiCl_4$, combinations thereof, or the like. One or more carrier gases may also be used during the plasma process, such as, Ar, He, Ne, combinations thereof, or the like. Further, the plasma process may be performed with a plasma source power in the range of about 10 W to about 3000 W, with a bias power in the range of about 0 W to about 3000 W, at a pressure of about 1 mTorr to about 800 mTorr, with a gas mixture flow rate of about 10 sccm to about 5000 sccm, or the like.

In some embodiments, etching the opening in the dummy gate electrode 503 includes a wet etch process (sometimes referred to as a wet clean). Embodiment etchants that may be used during the wet etch process may include HF, $F_2$, combinations thereof, or the like. The wet etch process may further include flowing an assisted etch chemical over the structure 100 for tuning (e.g., increasing) etch selectivity between the dummy gate electrode 503 and other features of the structure 100. Embodiment assisted etch chemicals may comprise chemical such as $H_2SO_4$, HCl, HBr, $NH_3$, combinations thereof, or the like. Deionized water (DIW), alcohol, acetone, or the like may be used as a solvent for mixing the etchant and/or the assisted etch chemical during the wet etch process.

According to some embodiments, a treatment process is applied to the structure 100, such as to sidewalls and a bottom surface of the opening in the dummy gate electrode 503. The treatment process may form passivation regions (not shown) on sidewalls and a bottom surface of the opening in the dummy gate electrode 503. In some embodiments, the passivation regions may also be formed in the gate spacers 905. Further although not explicitly illustrated, the treatment process may further form passivation regions in other exposed surfaces of the structure 100, such as upper surfaces of the dummy gate electrode 503 and upper surfaces of the interlayer dielectric layer 907. Such passivation regions may be removed in subsequent processing steps to shape a profile of the opening in the dummy gate electrode 503.

The treatment process may be a conversion process that converts an exposed portion of the dummy gate electrode 503 into the passivation region and converts an exposed portion of the gate spacer 905 into the passivation region. The treatment process may be performed in-situ (e.g., in a same process chamber) or ex-situ (e.g., in a different process chamber) of the etching process to form the opening in the dummy gate electrode 503. A respective thickness of each of the passivation regions may be in the range of about 2 Å to about 300 Å.

In some embodiments, the treatment process includes a plasma process, such as a plasma implantation, or the like. A passivation gas used during the plasma process may comprise $N_2$, $O_2$, $CO_2$, $SO_2$, CO, combination thereof, or the like. The plasma process may further include flowing an additional gas, such as a carbon-based ($CH_4$), a silicon-based gas (e.g., $SiCl_4$), combinations thereof, or the like, to help form the passivation regions. Further, the plasma process may be performed with a plasma source power in the range of about 10 W to about 3000 W, with a bias power in the range of about 0 W to about 3000 W, at a pressure of about 1 mTorr to about 800 mTorr, with a gas mixture flow rate of about 10 sccm to about 5000 sccm, or the like.

In some embodiments, the treatment process is a non-plasma, dry chemical treatment using a treatment gas, such as, HF, $NF_3$, $CH_4$, combinations thereof, or the like. In some embodiments, the treatment process is a wet treatment process, which uses a solution comprising deionized water (DIW), $O_3$, $CO_2$, HF, HCl, $NH_3$, combinations thereof, or the like. In some embodiments, the treatment process is a deposition process that reacts with existing materials of the dummy gate electrode 503 and the gate spacers 905 and also deposits a dielectric material (e.g., SiN, SiON, SiCON, SiC, SiOC, $SiO_2$, SiC, combinations thereof, or the like) on surfaces of the opening in the dummy gate electrode 503 and the gate spacers 905. In such embodiments, the passivation regions include the reacted areas of the dummy gate electrode 503, the reacted areas of the gate spacers 905, and the deposited dielectric material. Embodiment deposition processes may include an ALD process, a CVD process, combinations thereof, or the like.

Because a material of the dummy gate electrode 503 is different than material(s) of the gate spacers 905, the passivation region of the dummy gate electrode 503 may have a different material composition than the passivation region of the gate spacers 905. For example, in embodiments where the treatment process comprises using nitrogen and the gate spacers 905 comprise oxygen, the passivation region in the dummy gate electrode 503 may comprise silicon and nitrogen while the passivation region in the gate spacers 905 may comprise silicon, oxygen, and nitrogen. As another example where the treatment process comprises using oxygen and the gate spacers 905 comprise nitrogen, the passivation region in the dummy gate electrode 503 may comprise silicon and oxygen while the passivation region in the gate spacers may comprise silicon, oxygen, and nitrogen. As another example where the treatment process comprises using nitrogen and the gate spacers 905 comprise nitrogen, a nitrogen concentration of the passivation region in the dummy gate electrode 503 may be lower than a nitrogen concentration of the passivation region in the gate spacers 905. As another example where the treatment process comprises using oxygen and the gate spacers 905 comprise oxygen, an oxygen concentration of the passivation region in the dummy gate electrode 503 may be lower than an oxygen concentration of the passivation region in the gate spacers 905. Accordingly, the treatment process forms two different passivation regions, one region in the dummy gate electrode 503 and another region in the gate spacers 905, and etch selectivity can be achieved between the two different passivation regions. Etch selectivity can also be achieved between the passivation region in the gate spacers 905 and remaining portions of the gate spacers 905.

Once the opening is formed in the dummy gate electrode 503 and/or the passivation regions are formed in the dummy gate electrode 503 and the gate spacers 905, a further etch process is applied to the dummy gate electrode 503, which extends the opening further towards the dummy fin (if present) and the semiconductor substrate 101. In some embodiments, the opening in the dummy gate electrode 503 may be extended to expose the dummy fin (if present) or to expose the semiconductor substrate 101, if the dummy fin is not present.

The etch process may be selective between a material of the passivation region in the gate spacers 905 and a material of the gate spacers 905 such that the etch process removes the passivation region in the gate spacers 905 without substantially removing the remaining material of the gate spacers 905. For example, the etch process may remove the material of the passivation region in the gate spacers 905 at a greater rate than the remaining material of the gate spacers 905. As a result, an upper portion of the opening in the dummy gate electrode 503 may have a width that is greater than a width of a lower portion of the opening in the dummy gate electrode 503.

Further, the etch process may be a directional process, which removes the passivation region from bottom surfaces of the opening in the dummy gate electrode 503 without significantly removing the passivation region from along sidewalls of the opening. In some embodiments, the etch process may be selective between a material of the passivation region in the dummy gate electrode 503 and a material of the passivation region in the gate spacers 905. As such, the material of the passivation region in the gate spacers 905 along sidewalls of the opening is removed without significantly removing the material of the passivation region in the dummy gate electrode 503 along sidewalls of the opening. As a result, a profile of the opening in the dummy gate electrode 503 is shaped such that the opening is expanded and an effective gate width of the dummy gate electrode 503 (and corresponding replacement metal gate) can be maintained, thereby improving device performance of the resultant device.

In some embodiments, removing the passivation region in the gate spacers 905 and expanding the opening in the dummy gate electrode 503 includes a plasma process, such as a plasma etch, a remote plasma process, a radical etch, or the like. An etching gas used during the plasma process may comprise $Cl_2$, HBr, $CF_4$, $CHF_3$, $CH_2F_2$, $CH_3F$, $C_4F_6$, $BCl_3$, $SF_6$, $H_2$, combination thereof, or the like. The plasma process may further include flowing a passivation gas over the structure 100 for tuning (e.g., increasing) etch selectivity between the dummy gate electrode 503 and other features of the structure 100. Embodiment passivation gases may comprise $N_2$, $O_2$, $CO_2$, $SO_2$, CO, $SiCl_4$, combinations thereof, or the like. One or more carrier gases may also be used during the plasma process, such as, Ar, He, Ne, combinations thereof, or the like. Further, the plasma process may be performed with a plasma source power in the range of about 10 W to about 3000 W, with a bias power in the range of about 0 W to about 3000 W, at a pressure of about 1 mTorr to about 800 mTorr, with a gas mixture flow rate of about 10 sccm to about 5000 sccm, or the like.

In some embodiments, removing the passivation region in the gate spacers 905 and expanding the opening in the dummy gate electrode 503 includes a wet etch process (sometimes referred to as a wet clean). Embodiment etchants that may be used during the wet etch process may include HF, $F_2$, combinations thereof, or the like. The wet etch process may further include flowing an assisted etch chemical over the structure 100 for tuning (e.g., increasing) etch selectivity between the dummy gate electrode 503 and other features of the structure 100. Embodiment assisted etch chemicals may comprise $H_2SO_4$, HCl, HBr, $NH_3$, combinations thereof, or the like. Deionized water (DIW), alcohol, acetone, or the like may be used as a solvent for mixing the etchant and/or the assisted etch chemical during the wet etch process.

Although one treatment and etch cycle being applied to the opening in the dummy gate electrode 503 to expose the dummy fin (if present) or the substrate 101 (if the dummy fin is not present) is described, multiple treatments and etch cycles may be performed. For example, the steps described may be repeated any number of times until the dummy fin or the substrate 101 is exposed and the opening in the dummy gate electrode 503 has a desired profile. By repeating the treatment process and etch process described above, an atomic layer etch type process may be achieved to form an opening in the dummy gate electrode 503 with an expanded upper portion.

Once the opening in the dummy gate electrode 503 has been formed, the opening is filled with a dielectric material. The dielectric material may be deposited by PVD, CVD, ALD, PECVD, or the like. The dielectric material may initially be deposited to overfill the opening and cover top surfaces of the dummy gate electrode 503 and the interlayer dielectric layer 907. Subsequently, a planarization process (e.g., CMP, or the like) may be performed to remove excess dielectric material from above the dummy gate electrode 503 and the interlayer dielectric layer 907.

In embodiments comprising the dummy fin, the dielectric material in combination of with the dummy fin separates the dummy gate electrode 503 into different device regions (e.g., the device region 120, the first multi-channel device region 130, and/or the second multi-channel device region 140). As such, the combination of the dummy fin and the dielectric material separating the dummy gate electrode 503 may be referred to herein as an optional cut-dummy-gate structure.

In embodiments, which do not include the dummy fin, the opening in the dummy gate electrode 503 may be formed through the entirety of dummy gate electrode 503 to expose the isolation regions 401 within the opening. Still in further embodiments, the opening may be extended further into the isolation regions 401 or may even be extended through the isolation regions 401 thus exposing and/or extended into the substrate 101. In such embodiments, once the opening is filled with the dielectric material, the dielectric material alone separates the dummy gate electrode 503 into different regions. As such, the dielectric material separating the dummy gate electrode 503 may also be referred to herein as an optional cut-dummy-gate structure. The optional cut-dummy-gate structures may be located at one or more of the interfaces between the device region 120, the first multi-channel device region 130, and the second multi-channel device region 140, for example. Thus, the optional cut-dummy-gate structures may provide isolation between adjacent active components.

Turning to FIGS. 6, 7A and 7B, once the optional cut-dummy-gate structures (not shown) have been formed through the dummy gate electrode 503, the remaining parts of the dummy gate electrode 503 may be removed similar to the removal of the dummy gate electrode 503 set forth above, without removing the optional cut-dummy-gate structures. As such, the dummy gate dielectric layers 501 and the optional cut-dummy-gate structures are exposed between the gate spacers 905. Once exposed, the dummy gate dielectric layers 501 are removed and replaced with the first dielectric layer 707, the second dielectric layer 803, and/or the outer gate dielectric layer 1001, as describe above with regard to FIGS. 7A, 7B and 10.

Once the dummy gate dielectric layers 501 have been replaced, the metal gate electrode 805 may be formed in the openings between the gate spacers 905 and over the optional cut-dummy-gate structures, the fins 105 of the device region 120, the fin 105 of the first multi-channel region 130, and the fins 105 of the second multi-channel region 140, similar to the formation of the metal gate electrode 805 described above with regard to FIG. 8. In embodiments including the optional cut-dummy-gate structures, the materials of the metal gate electrode 805 may be planarized (e.g., using a chemical mechanical polishing technique) with the optional cut-dummy-gate structures, the contact etch stop layers 903, the gate spacers 905, and the interlayer dielectric layer 907. As such, the optional cut-dummy-gate structures are located between and isolate gate electrodes 805 of adjacent active components similar to the cut-metal-gate structures 1101 illustrated in FIGS. 11A and 11B.

Figure 12:
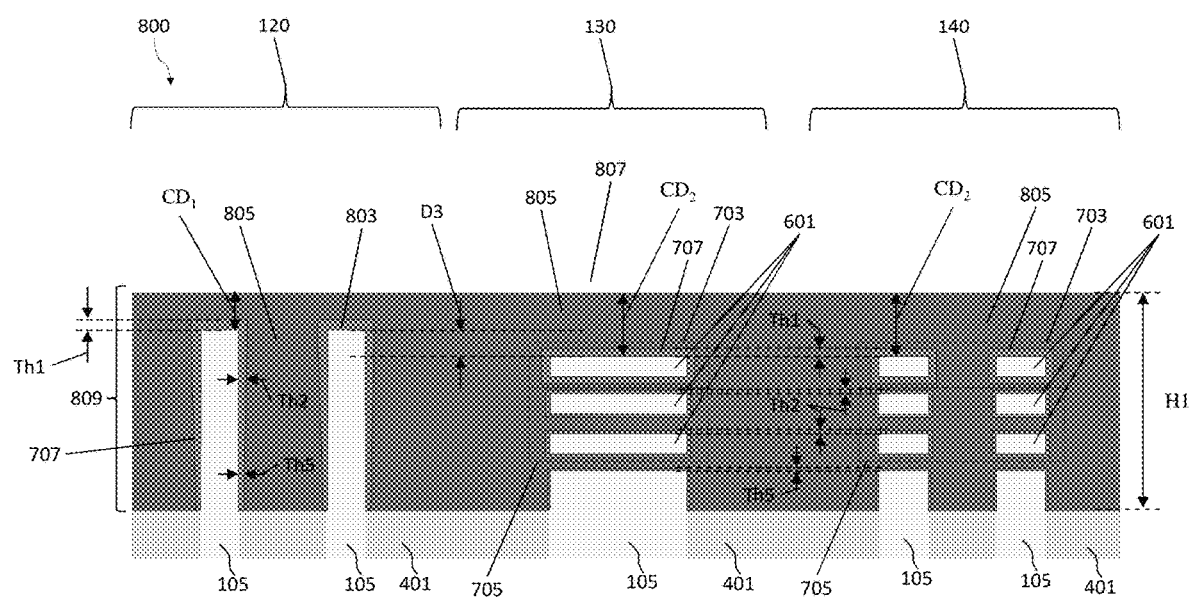
FIG. 12 illustrates the integrated circuit according to still further embodiments.

FIG. 12 illustrates the integrated circuit device 800 according to still further embodiments. In particular, FIG. 12 illustrates forming the first gate dielectric layers 707 over the fins 105 of the device region 120 in a same non-conformal treatment step with the channel regions of the first multi-channel device region 130 and the second multi-channel device region 140. As such, the first interface treatment 700 may be performed without first protecting the device region 120. Furthermore, the first interface treatment 700 may be performed using a non-conformal treatment such that the first gate dielectric layers 707 is formed with a thickness gradient over the fins 105 in the device region 120 and at the interfaces of the nanostructures 601 and the fins 105 of the first multi-channel device region 130 and the second multi-channel device region 140.

According to some embodiments, the first gate dielectric layers 707 may be formed with the thickness gradient using the first interface treatment 700. By controlling the number of deposition cycles and/or the time of deposition of each deposition cycle of the first interface treatment 700, the thickness gradient of the first gate dielectric layers 707 may be formed to a greater thickness at the interfaces furthest from the isolation regions 401 and may be formed to a lesser thickness at the interfaces closer to the isolation regions 401.

In some embodiments, the first gate dielectric layers 707 is formed to the first thickness Th1 at interfaces of the tops of the fins 105 in the device region 120 and at the interfaces of the nanostructures 601 of the topmost channels 703 of the first multi-channel device region 130 and the second multi-channel device region 140. Furthermore, the first gate dielectric layers 707 may be formed, for example, to the second thickness Th2 at the interfaces of the middle sections of the fins 105 in the device region 120 and at the interfaces of the nanostructures 601 of the remaining channels 705 of the nanostructure stacks 603. According to some embodiments, the interfaces at the bottom sections of the fins 105 in the device region 120 and at the interfaces of the fins 105 in the first multi-channel device region 130 and in the second multi-channel device region 140 may be formed to a fifth thickness Th5, the fifth thickness Th5 being less than the second thickness Th2. According to some embodiments, the fifth thickness Th5 may be a thickness between about 3 Å and about 45 Å.

According to some embodiments, the outer gate dielectric layer 1001 (illustrated in FIG. 10) may be deposited at the interfaces of the nanostructures 601 of the topmost channels 703 of the first multi-channel device region 130 and/or the second multi-channel device region 140 illustrated in FIG. 12. In some embodiments, the outer gate dielectric layer 1001 may be formed by initially forming the protective material 701 (e.g., photoresist) over the first gate dielectric layers 707 and the fins 105 of the device region 120. Once the device region 120 has been protected, the outer gate dielectric layer 1001 may be formed using the materials and processes described above. After the outer gate dielectric layer 1001 has been formed, the protective material 701 may be removed and the shared gate stack 809 can be formed using the materials and processes discussed above. According to some further embodiments, one or more of the cut-metal gate structures 1101 may be formed through the shared gate stack 809 of FIG. 12 to divide the shared gate stack 809 into one or more isolated gate structures and/or one or more shared gate structures, as discussed above with regard to FIGS. 11A and 11B. Furthermore, any of the embodiments of the first gate dielectric layers 707 illustrated in FIG. 12 may be used with any of the embodiments including the optional cut-dummy-gate structures, as described above.

The embodiments disclosed herein provide one or more of the following advantages and/or benefits for semiconductor devices of the integrated circuit device 800. For example, by forming the shared gate stack 809 with the first critical dimension $CD_1$ of at least 10 Å prevents the occurrence of high leakage currents in the devices formed in the device region 120. Additionally, by forming the shared gate stack 809 with the second critical dimension $CD_2$ being no more than about 500 Å, this allows for efficient device performance of the multichannel devices formed in the first multi-channel device region 130 and/or in the second multi-channel device region 140 without the device performance from becoming saturated. Furthermore, by forming the first thickness Th1 of the first gate dielectric layers 707 surrounding the topmost channels 703 to a thickness of no more than about 50 Å prevents the operating voltages of the multi-channel devices from increasing to voltages that are too high. In addition, by forming the second thickness Th2 of the first gate dielectric layers 707 surrounding the remaining channels 705 to at least about 3 Å, this allows for the multi-channel devices to operate at voltages that are not too low.

In embodiments comprising the outer gate dielectric layer 1001, the added fourth thickness Th4 of the outer gate dielectric layer 1001 allows for the differences between the thicknesses of the topmost channels 703 and the thicknesses of the remaining channels 705 of the multi-channel devices to be easily controlled to be within a desired range of thicknesses. As such, the desired second critical dimension $CD_2$ and thus the operating voltage and/or the efficiency of the device performance for the multi-channel devices may be easy to control, as discussed above.

Furthermore, by forming the fourth thickness Th4 to a thickness of no more than about 50 Å prevents the operating voltages of the multi-channel devices from increasing to voltages that are too high. By forming the fourth thickness Th4 to at least about 3 Å, further allows for the multi-channel devices to operate at voltages that are not too low. As such, the operation of the multi-channel devices is easy to control.

According to some embodiments, a method includes forming a semiconductor fin over a substrate; forming a multi-channel fin over the substrate, the multi-channel fin including a sacrificial material; removing the sacrificial material from the multi-channel fin without removing material from the semiconductor fin; after the removing the sacrificial material, forming a stack of nanostructures from the multi-channel fin; and forming a gate electrode over the stack of nanostructures and the semiconductor fin. In some embodiments, the sacrificial material has a thickness of between about 0.5 Å and about 300 Å. In some embodiments, the method further includes forming a first dielectric layer to a first thickness surrounding a first nanostructure of the stack of nanostructures; and forming the first dielectric layer to a second thickness surrounding a second nanostructure of the stack of nanostructures, the second nanostructure being a topmost nanostructure of the stack of nanostructures and the second thickness being greater than the first thickness. In an embodiment, the forming the first dielectric layer includes performing an interface treatment to the stack of nanostructures. In an embodiment, the first dielectric layer is a native oxide. In an embodiment, the method includes forming a second dielectric layer to a third thickness surrounding the first dielectric layer that is surrounding the topmost nanostructure, the second dielectric layer being different from the native oxide. In an embodiment of the method, a sum of the second thickness and the third thickness is no greater than 50 Å.

According to another embodiment, a method includes forming a first fin over a substrate; forming a second fin over the substrate, the second fin including a multilayer stack of semiconductor materials and a sacrificial layer over the multilayer stack; removing the sacrificial layer; forming nanostructures from the multilayer stack after the removing the sacrificial layer; and forming a gate electrode over the first fin and the nano structures, a top surface of the gate electrode being a first distance from the first fin and a second distance from a topmost nanostructure of the nanostructures, the second distance being greater than the first distance. In an embodiment of the method, the first distance is at least 10 Å. In an embodiment of the method, the second distance is at most 500 Å. In an embodiment, the method further includes forming a first dielectric layer over the nanostructures, the first dielectric layer being formed to a first thickness at a first interface with a first nanostructure of the nanostructures and being formed to a second thickness at a second interface with the topmost nanostructure of the nanostructures, the second thickness being greater than the first thickness. In an embodiment of the method, the forming the first dielectric layer further includes using a first selective treatment. In an embodiment, the method further includes forming a material layer surrounding the first dielectric layer. In an embodiment of the method, a sum of a first thickness of the first dielectric layer and a second thickness of the material layer is between about 6 Å and about 110 Å.

In yet another embodiment, a semiconductor device includes a semiconductor fin over a substrate; a multi-channel device over the substrate; a first gate dielectric including a first interface surrounding a topmost nanostructure of the multi-channel device and a second interface surrounding another nanostructure of the multi-channel device, a first thickness of the first gate dielectric at the first interface being greater than a second thickness of the first gate dielectric at the second interface; and a gate electrode over and surrounding the first gate dielectric at the first interface and at the second interface, the gate electrode having a first height over the semiconductor fin and a second height greater than the first height over the topmost nanostructure. In an embodiment of the semiconductor device, the first gate dielectric includes a first native oxide layer at the first interface. In an embodiment of the semiconductor device, the first gate dielectric includes a second material including a third interface surrounding and adjacent to the first native oxide layer. In an embodiment of the semiconductor device, the first height is at least about 10 Å. In an embodiment of the semiconductor device, the second height is less than about 500 Å. In an embodiment of the semiconductor device, the semiconductor fin is part of a fin field effect transistor and the multi-channel device is a nanosheet field effect transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a semiconductor fin over a substrate;
   forming a multi-channel fin over the substrate, the multi-channel fin comprising a sacrificial material;
   removing the sacrificial material from the multi-channel fin without removing material from the semiconductor fin;
   after the removing the sacrificial material, forming a stack of nanostructures from the multi-channel fin;
   forming a gate electrode over the stack of nanostructures and the semiconductor fin;
   forming a first dielectric layer to a first thickness surrounding a first nanostructure of the stack of nanostructures; and
   forming the first dielectric layer to a second thickness surrounding a second nanostructure of the stack of nanostructures, the second nanostructure being a topmost nanostructure of the stack of nanostructures and the second thickness being greater than the first thickness.

2. The method of claim 1, wherein the sacrificial material has a thickness of between about 0.5 Å and about 300 Å.

3. The method of claim 1, wherein the forming the first dielectric layer comprises performing an interface treatment to the stack of nanostructures.

4. The method of claim 1, wherein the first dielectric layer is a native oxide.

5. The method of claim 4, further comprises forming a second dielectric layer to a third thickness surrounding the first dielectric layer that is surrounding the topmost nanostructure, the second dielectric layer being different from the native oxide.

6. The method of claim 5, wherein a sum of the second thickness and the third thickness is no greater than 50 Å.

7. The method of claim 1, whereinafter the forming the first dielectric layer the semiconductor fin is part of a fin field effect transistor and the stack of nanostructures is part of a nanosheet field effect transistor.

8. A method comprising:
forming a first fin over a substrate;
forming a second fin over the substrate, the second fin comprising a multilayer stack of semiconductor materials and a sacrificial layer over the multilayer stack;
removing the sacrificial layer;
forming nanostructures from the multilayer stack after the removing the sacrificial layer;
forming a gate electrode over the first fin and the nanostructures, a top surface of the gate electrode being a first distance from the first fin and a second distance from a topmost nanostructure of the nanostructures, the second distance being greater than the first distance; and
forming a first dielectric layer over the nanostructures, the first dielectric layer being formed to a first thickness at a first interface with a first nanostructure of the nanostructures and being formed to a second thickness at a second interface with the topmost nanostructure of the nanostructures, the second thickness being greater than the first thickness.

9. The method of claim 8, wherein the first distance is at least 10 Å.

10. The method of claim 9, wherein the second distance is at most 500 Å.

11. The method of claim 8, wherein the forming the first dielectric layer further comprises using a first selective treatment.

12. The method of claim 11 further comprises forming a material layer surrounding the first dielectric layer.

13. The method of claim 12, wherein a sum of a first thickness of the first dielectric layer and a second thickness of the material layer is between about 6 Å and about 110 Å.

14. The method of claim 8, wherein the sacrificial layer has a thickness of between about 0.5 Å and about 300 Å.

15. A semiconductor device comprising:
a semiconductor fin over a substrate;
a multi-channel device over the substrate;
a first gate dielectric comprising a first interface surrounding a topmost nanostructure of the multi-channel device and a second interface surrounding another nanostructure of the multi-channel device, a first thickness of the first gate dielectric at the first interface being greater than a second thickness of the first gate dielectric at the second interface; and
a gate electrode over and surrounding the first gate dielectric at the first interface and at the second interface, the gate electrode having a first height over the semiconductor fin and a second height greater than the first height over the topmost nanostructure.

16. The semiconductor device of claim 15, wherein the first gate dielectric comprises a first native oxide layer at the first interface.

17. The semiconductor device of claim 16, wherein the first gate dielectric comprises a second material comprising a third interface surrounding and adjacent to the first native oxide layer.

18. The semiconductor device of claim 15, wherein the first height is at least about 10 Å.

19. The semiconductor device of claim 15, wherein the second height is less than about 500 Å.

20. The semiconductor device of claim 15, wherein the semiconductor fin is part of a fin field effect transistor and the multi-channel device is a nanosheet field effect transistor.

* * * * *